(12) United States Patent
Kawaguchi et al.

(10) Patent No.: US 10,615,793 B2
(45) Date of Patent: Apr. 7, 2020

(54) DEFORMABLE INPUT APPARATUS AND ELECTRONIC APPARATUS INCLUDING KEY REGIONS

(71) Applicant: Sony Corporation, Tokyo (JP)

(72) Inventors: Hiroto Kawaguchi, Kanagawa (JP); Shogo Shinkai, Kanagawa (JP); Tetsuro Goto, Tokyo (JP); Toshio Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 71 days.

(21) Appl. No.: 14/777,776

(22) PCT Filed: Jan. 30, 2014

(86) PCT No.: PCT/JP2014/000493
§ 371 (c)(1),
(2) Date: Sep. 17, 2015

(87) PCT Pub. No.: WO2014/162647
PCT Pub. Date: Oct. 9, 2014

(65) Prior Publication Data
US 2016/0294388 A1 Oct. 6, 2016

(30) Foreign Application Priority Data

Apr. 4, 2013 (JP) .................................. 2013-078610

(51) Int. Cl.
*G06F 3/045* (2006.01)
*H03K 17/96* (2006.01)

(52) U.S. Cl.
CPC . *H03K 17/9622* (2013.01); *H03K 2017/9602* (2013.01); *H03K 2017/9615* (2013.01);
(Continued)

(58) Field of Classification Search
CPC ..... H03K 17/6922; H03K 2217/96062; H03K 2217/960705; H03K 2017/9602
See application file for complete search history.

(56) References Cited

U.S. PATENT DOCUMENTS 4,268,815 A    5/1981  Eventoff et al.
4,659,879 A  * 4/1987  Hasegawa ............ H01H 13/702
                                                    200/5 A
(Continued)

FOREIGN PATENT DOCUMENTS

JP    59-119621 A    7/1984
JP    61-173333 A    8/1986
(Continued)

OTHER PUBLICATIONS

International Search Report and Written Opinion dated May 6, 2014 in connection with International Application No. PCT/JP2013/007389.

(Continued)

*Primary Examiner* — Jonathan M Blancha
(74) *Attorney, Agent, or Firm* — Wolf, Greenfield & Sacks, P.C.

(57) ABSTRACT

An input apparatus according to an embodiment of the present technology includes an operation member, an electrode substrate, and a first support. The operation member includes a plurality of key regions and is configured to be deformable. The electrode substrate includes a first capacitive element arranged opposed to each of the plurality of key regions and a second capacitive element arranged around the first capacitive element. The electrode substrate is capable of electrostatically detecting a change of a distance from each of the plurality of key regions. The first support includes a plurality of first structures and a first space. The plurality of first structures connect between the electrode substrate and the operation member. The first space is formed between the (Continued)

plurality of first structures and capable of changing the distance between each of the plurality of key regions and the electrode substrate according to an input operation.

12 Claims, 19 Drawing Sheets

(52) U.S. Cl.
CPC .............. *H03K 2217/96062* (2013.01); *H03K 2217/96077* (2013.01); *H03K 2217/960705* (2013.01); *H03K 2217/960775* (2013.01)

(56) References Cited

U.S. PATENT DOCUMENTS

| | | | |
|---|---|---|---|
| 5,063,306 | A | 11/1991 | Edwards |
| 8,913,031 | B2 | 12/2014 | Honda et al. |
| 9,310,200 | B2 | 4/2016 | Kabasawa et al. |
| 9,664,947 | B2 | 5/2017 | Kawaura |
| 9,760,183 | B2 | 9/2017 | Kawaguchi et al. |
| 9,785,297 | B2 | 10/2017 | Kawaguchi et al. |
| 9,811,226 | B2 | 11/2017 | Itaya et al. |
| 10,055,067 | B2 | 8/2018 | Shinkai et al. |
| 10,115,543 | B2 | 10/2018 | Katsuhara et al. |
| 10,282,041 | B2 | 5/2019 | Shinkai et al. |
| 2003/0222660 | A1* | 12/2003 | Morimoto ............... G01L 1/142 324/661 |
| 2006/0243462 | A1 | 11/2006 | Schilling et al. |
| 2007/0074903 | A1* | 4/2007 | Ide .................... H01H 13/7006 174/262 |
| 2007/0257821 | A1 | 11/2007 | Son et al. |
| 2008/0202251 | A1* | 8/2008 | Serban .................... G01L 1/142 73/780 |
| 2009/0128374 | A1* | 5/2009 | Reynolds .............. G06F 3/0202 341/33 |
| 2010/0028811 | A1* | 2/2010 | Geaghan ................. G06F 3/044 430/319 |
| 2011/0069036 | A1* | 3/2011 | Anno .................. G06F 3/03545 345/174 |
| 2011/0090169 | A1* | 4/2011 | Karhiniemi ......... G06F 3/04883 345/173 |
| 2011/0162944 | A1 | 7/2011 | Liu et al. |
| 2011/0175845 | A1 | 7/2011 | Honda et al. |
| 2011/0240989 | A1 | 10/2011 | Sekine et al. |
| 2012/0113071 | A1 | 5/2012 | Kawaguchi et al. |
| 2012/0256844 | A1* | 10/2012 | Takeda .................. G06F 3/0202 345/170 |
| 2013/0063356 | A1 | 3/2013 | Martisauskas |
| 2013/0076994 | A1 | 3/2013 | Kawaura |
| 2014/0007682 | A1 | 1/2014 | Kabasawa et al. |
| 2015/0270076 | A1 | 9/2015 | Katsuhara et al. |
| 2015/0277626 | A1 | 10/2015 | Shinkai et al. |
| 2015/0280708 | A1 | 10/2015 | Goto et al. |
| 2015/0346839 | A1 | 12/2015 | Kawaguchi et al. |
| 2015/0363023 | A1 | 12/2015 | Kawaguchi et al. |
| 2016/0011691 | A1 | 1/2016 | Shinkai et al. |
| 2016/0026297 | A1 | 1/2016 | Shinkai et al. |
| 2016/0202800 | A1 | 7/2016 | Itaya et al. |
| 2017/0364182 | A1 | 12/2017 | Kawaguchi et al. |
| 2018/0088709 | A1 | 3/2018 | Itaya et al. |

FOREIGN PATENT DOCUMENTS

| | | |
|---|---|---|
| JP | 01-294325 A | 11/1989 |
| JP | 09-179679 A | 7/1997 |
| JP | 11-136116 A | 5/1999 |
| JP | 2012-146267 A | 8/2012 |
| WO | WO 87/04851 A1 | 8/1987 |

OTHER PUBLICATIONS

International Preliminary Report on Patentability dated Aug. 6, 2015 in connection with International Application No. PCT/JP2013/007389.

International Search Report and Written Opinion and English translation thereof dated Apr. 28, 2014 in connection with International Application No. PCT/JP2014/000493.

International Preliminary Report on Patentability and English translation thereof dated Oct. 15, 2015 in connection with International Application No. PCT/JP2014/000493.

Partial European Search Report dated Oct. 4, 2016 in connection with European Application No. 14779049.7.

Extended European Search Report dated Jan. 17, 2017 in connection with European Application No. 14779049.7.

* cited by examiner

DEFORMABLE INPUT APPARATUS AND ELECTRONIC APPARATUS INCLUDING KEY REGIONS

This Application is a national stage filing under 35 U.S.C. 371 of International Patent Application Serial No. PCT/JP2014/000493, filed Jan. 30, 2014, entitled "INPUT DEVICE AND ELECTRONIC APPARATUS", claims priority under 35 U.S.C. § 119(a)-(d) or 35 § 365(b) to Japanese application number 2013-078610, filed Apr. 4, 2013, the entire contents of which are incorporated herein by reference in their entireties.

TECHNICAL FIELD

The present technology relates to an input apparatus and an electronic apparatus that are capable of electrostatically detecting an input operation.

BACKGROUND ART

As an input apparatus capable of electrostatically detecting an input operation, an input apparatus that enables an key input to be performed by touching a keyboard displayed on a screen is known. For example, Patent Document 1 discloses an input device in which a GUI component such as a software keyboard is displayed on a touch panel functioning as a display device and, by touching a displayed key, that key is displayed.

Patent Document 1: Japanese Patent Application Laid-open No. 2012-146267

SUMMARY OF INVENTION

Problem to be Solved by the Invention

In the input apparatus using the touch panel displaying the keyboard, an operator cannot place the finger on the key on the screen. In other words, the operator always needs to touch a desired key region from a state in which the operator separates the finger therefrom. Thus, the operability is lowered. Further, stroke feeling and click feeling cannot be provided. Thus, it is disadvantageous in that it is not suitable for high-speed inputs.

In view of the above-mentioned circumstances, it is an object of the present technology to provide an input apparatus and an electronic apparatus that are capable of providing the stroke feeling and click feeling while ensuring the operability of the key inputs.

Means for Solving the Problem

In order to achieve the above-mentioned object, an input apparatus according to an embodiment of the present technology includes an electrode substrate and a first support.

The operation member includes a plurality of key regions and is configured to be deformable.

The electrode substrate includes a first capacitive element arranged opposed to each of the plurality of key regions and a second capacitive element arranged around the first capacitive element. The electrode substrate is capable of electrostatically detecting a change of a distance from each of the plurality of key regions.

The first support includes a plurality of first structures and a first space. The plurality of first structures connect between the electrode substrate and the operation member. The first space is formed between the plurality of first structures and capable of changing the distance between each of the plurality of key regions and the electrode substrate according to an input operation.

The input apparatus detects the input operation with respect to the key region, using a change of capacitance of the first and second capacitive elements based on a change of a distance by which each of the first and second capacitive elements is opposed to the key region. This enables the input operation to be performed in a state in which the finger or the like is placed on the operation member. Thus, it is possible to prevent the operability from being lowered. Further, each key region is supported on the electrode substrate via the first space formed between the plurality of first structures. Thus, predetermined stroke feeling and click feeling can be provided.

In addition, in the electrode substrate, the first capacitive elements and the second capacitive elements arranged around them are provided corresponding to each key region. Thus, a stable input operability irrespective of the input area and the input position can be provided.

The first capacitive element may be arranged opposed to a center portion of each of the plurality of key regions. In this case, the second capacitive element is arranged opposed to a circumferential portion of each of the plurality of key regions. With this, for example, the variation of the detection sensitivity between the center position and the circumferential position of the key region can be suppressed.

The electrode substrate may further include a limitation layer. The limitation layer is provided between the second capacitive element and the operation member and partially limits a thickness of the first space. The limitation layer is typically formed of a dielectric material. With this, the sensitivity of the second capacitive elements is enhanced and the variation of the operability due to the input area and the input position can be suppressed.

The operation member may further include a conductor layer provided on a surface opposed to the electrode substrate. With this, for example, it becomes possible to perform a suitable input operation also in a state the user wears gloves, for example.

The input apparatus may further include a base substrate and a second support.

The base substrate is provided opposed to the operation member while sandwiching the electrode substrate therebetween and includes a conductor layer on a surface opposed to the electrode substrate.

The second support includes a plurality of second structures and a second space. The plurality of second structures connect between the electrode substrate and the base substrate and are respectively opposed to the plurality of first structures while sandwiching the electrode substrate therebetween. The second space is formed between the plurality of second structures and capable of changing the distance between the electrode substrate and the base substrate according to an input operation.

In this case, the first support may further include a plurality of third structures. The plurality of third structures connect between the electrode substrate and the operation member and are arranged in the first space.

According to the input apparatus, a relative distance between each of the operation member and the conductor layer and the electrode substrate when pressed from above the operation member changes. Thus, it becomes possible to electrostatically detect the input operation, for example, press on the basis of the change of the distance thereof. Therefore, the amount of capacitance change based on the input operation can be increased and it becomes possible to enhance the detection sensitivity.

The operation member may further include a coupling region that is supported by the plurality of first structures and couples the plurality of key regions to each other. In this case, the coupling region is formed to have flexural rigidity lower than that of the plurality of key regions. In this configuration, the variation of the operability due to a difference between the input area and the input position can be further suppressed.

In this case, the plurality of key regions may be formed to have a thickness larger than that of the coupling region. With this, the flexural rigidity of the key region can be easily made higher than that in the coupling region.

The input apparatus may further include a control unit.

The control unit is electrically connected to the electrode substrate and configured to generate information on an input operation with respect to each of the plurality of key regions on the basis of outputs of the first capacitive element and the second capacitive element.

The control unit may be configured to output an input signal if an amount of capacitance change of the first capacitive element is above a first threshold and an amount of capacitance change of the second capacitive element is above a second threshold smaller than the first threshold.

Alternatively, the control unit may be configured to output an input signal if a difference between an amount of capacitance change of the first capacitive element and an amount of capacitance change of the second capacitive element is above a predetermined threshold.

Alternatively, the control unit may be configured to output an input signal if an amount of capacitance change of the first capacitive element is above a first predetermined value and a time rate of change of capacitance of the first capacitive element is above a second predetermined value.

An electronic apparatus according to an embodiment of the present technology includes an operation member, an electrode substrate, a first support, and a control unit.

The operation member includes a plurality of key regions and is configured to be deformable.

The electrode substrate includes a first capacitive element that is arranged opposed to each of the plurality of key regions, and a second capacitive element that is arranged around the first capacitive element. The electrode substrate is configured to be capable of electrostatically detecting the change of the distance from each of the plurality of key regions.

The first support includes a plurality of first structures and a first space. The plurality of first structures connect between the electrode substrate and the operation member. The first space is formed between the plurality of first structures and configured to be capable of changing a distance between each of the plurality of key regions and the electrode substrate according to an input operation.

The control unit is electrically connected to the electrode substrate and configured to generate information on an input operation with respect to each of the plurality of key regions on the basis of outputs of the first capacitive element and the second capacitive element.

Effect of the Invention

As described above, according to the present technology, it is possible to ensure the operability of the key inputs.

MODE(S) FOR CARRYING OUT THE INVENTION

Hereinafter, embodiments according to the present technology will be described with reference to the drawings.

First Embodiment

Figure 1:
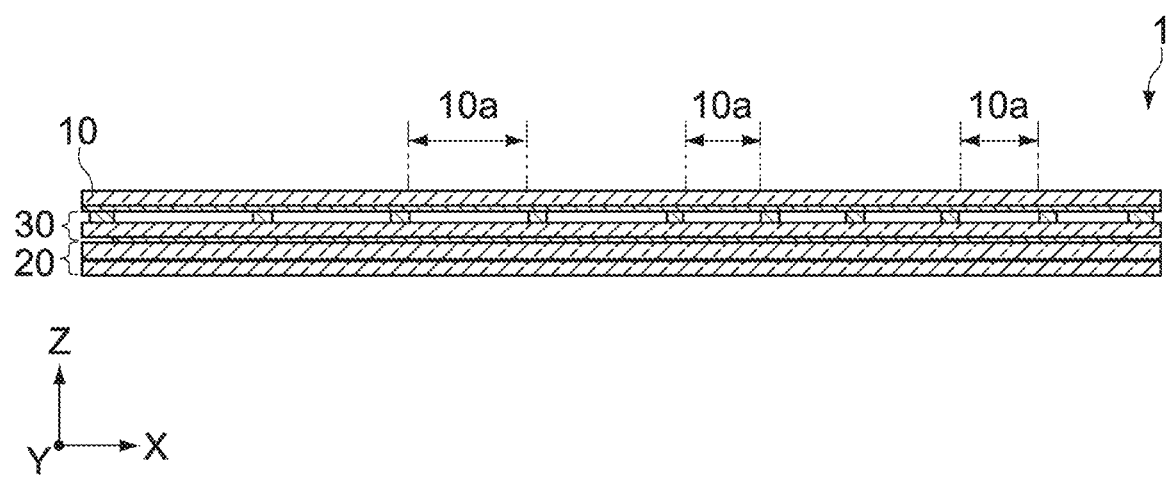
FIG. 1 A schematic cross-sectional view of an input apparatus according to a first embodiment of the present technology.
Figure 2:
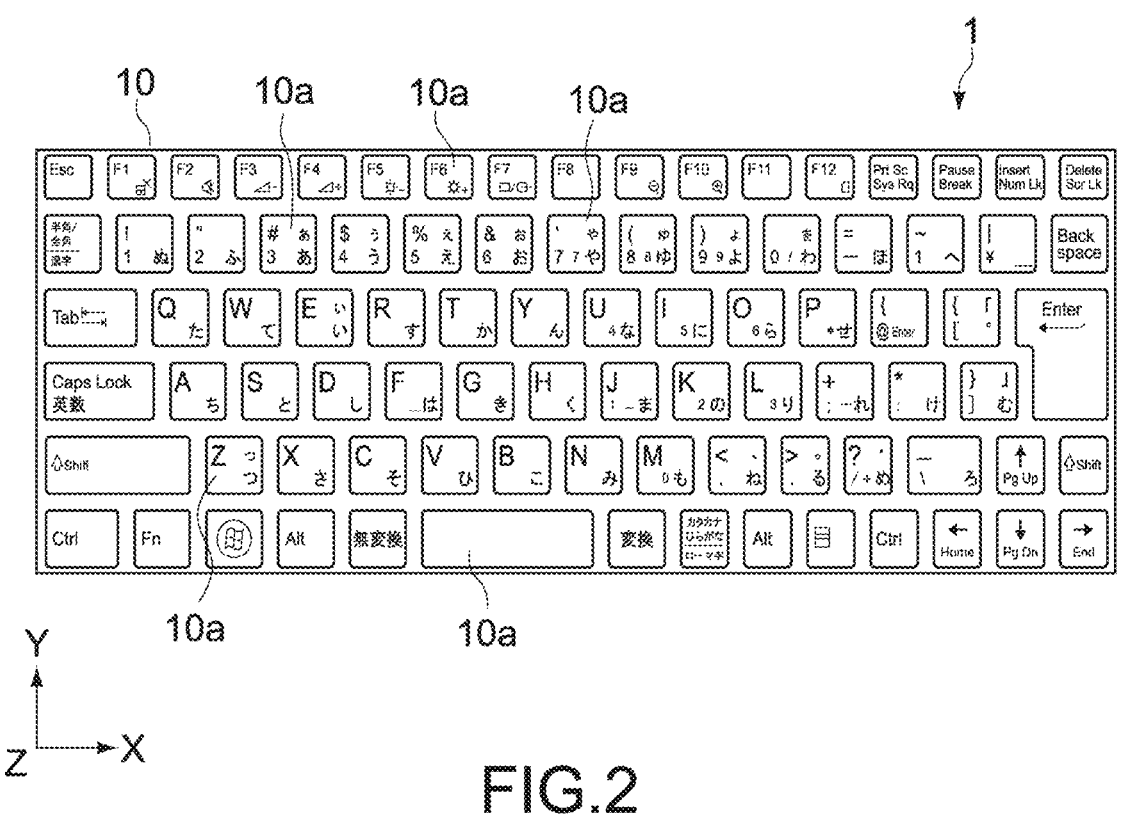
FIG. 2 A plan view of the input apparatus.
Figure 3:
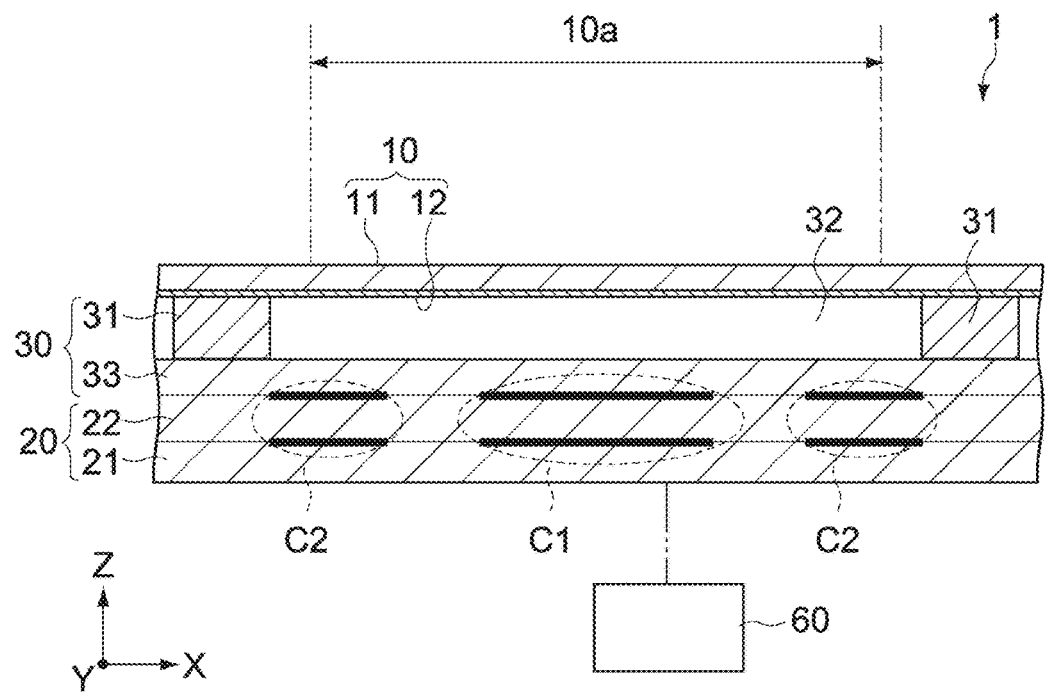
FIG. 3 A main-part enlarged cross-sectional view of the input apparatus.

FIG. 1 is a schematic cross-sectional view of an input apparatus according to a first embodiment of the present technology. FIG. 2 is a plan view of the input apparatus. FIG. 3 is a main-part enlarged cross-sectional view of the input apparatus.

Hereinafter, the configuration of an input apparatus 1 of this embodiment will be described. Note that, in the figure, an X-axis and a Y-axis show directions orthogonal to each other (in-plane direction of the input apparatus 1) and a Z-axis shows a direction orthogonal to the X-axis and Y-axis (thickness direction of the input apparatus 1).

[Basic Configuration of Input Apparatus]

The input apparatus 1 includes an operation member 10, an electrode substrate 20, and a support 30 (first support). The input apparatus 1 is configured as a keyboard apparatus of an electronic apparatus such as a computer.

The operation member 10 includes a plurality of key regions 10a and is configured to be deformable.

The electrode substrate 20 includes first capacitive elements C1 arranged opposed to the plurality of key regions 10a and second capacitive elements C2 respectively arranged around the first capacitive elements C1. The electrode substrate 20 is configured to be capable of electrostatically detecting a change of a distance from each of the plurality of key regions 10a.

The support 30 includes a plurality of structures 31 (first structure) and a space 32 (first space). The plurality of structures 31 connect between the electrode substrate 20 and the operation member 10. The first space 32 is formed among the plurality of structures 31. The first space 32 is configured to be capable of changing a distance between each of the key regions 10a and the electrode substrate 20 according to an input operation.

(Operation Member)

In this embodiment, the operation member 10 has a laminated structure of a base material 11 and a conductor layer 12.

The base material 11 is, for example, formed of a flexible insulation plastic sheet of PET (polyethylene terephthalate), PEN (polyethylene naphthalate), PMMA (polymethyl methacrylate), PC (polycarbonate), PI (polyimide), or the like. The thickness of the base material 11 is not particularly limited and is, for example, approximately several tens to several hundreds μm. In a top surface of the operation member 10, the plurality of key regions 10a are arrayed.

The conductor layer 12 is provided on a back surface of the base material 11, which is opposed to the electrode substrate 20. The conductor layer 12 is formed of a metal foil or mesh material of Cu (copper), Al (aluminum), or the like. The conductor layer 12 is configured to be partially deformable toward the electrode substrate 20 when receiving input operations with respect to the plurality of key regions 10a. The thickness of the conductor layer 12 is not particularly limited and is, for example, several tens nm to several tens μm. The conductor layer 12 is typically connected to a ground potential.

The base material 11 and the conductor layer 12 may be formed of, for example, a composite sheet obtained by bonding a metal foil onto a surface of a resin sheet in advance. The base material 11 and the conductor layer 12 may be formed of, for example, a deposition film or sputtering film formed on the surface of the base material 11. Alternatively, the base material 11 and the conductor layer 12 may be a coating film of a conductive paste or the like printed on the surface of the base material 11. Still alternatively, the conductor layer 12 may be omitted according to the specifications of the input apparatus 1.

Each of the key regions 10a corresponds to a key top pressed and operated by a user and has shape and size depending on the type of the key. Each of the key regions 10a is configured to be deformable toward the electrode substrate 20 according to a press operation (input operation) made by a finger of the user or an operation element such as a stylus.

Key display may be performed on each of the key regions 10a if necessary. The key display may display the type of the key, the position (outline) of the individual key, or the both. A suitable printing method, for example, screen printing, flexography, or rotogravure can be adopted for the display.

The base material 11 may be formed of a conductive material such as a metal. With this, the conductor layer 12 becomes unnecessary, which can make the operation member 10 thin. In this case, the base material 11 also functions as the conductor layer 12 and is, for example, connected to the ground potential.

(Electrode Substrate)

Figure 4:
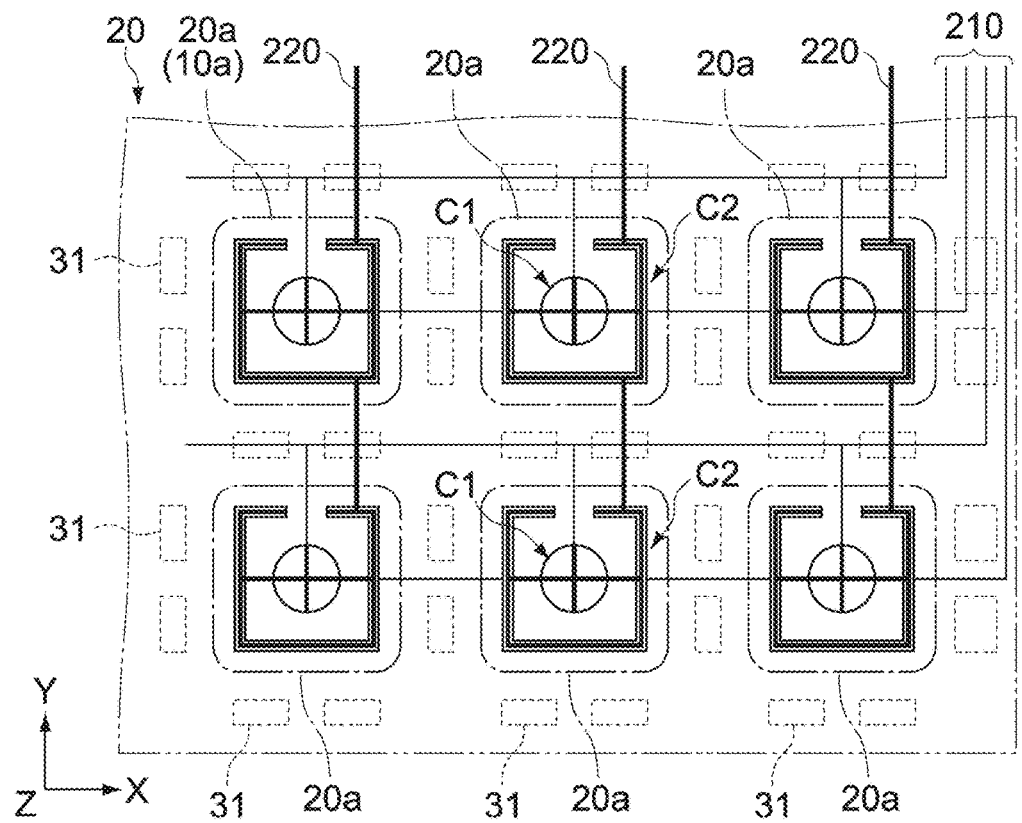
FIG. 4 A main-part plan view showing the configuration of an electrode substrate in the input apparatus.
Figure 5:
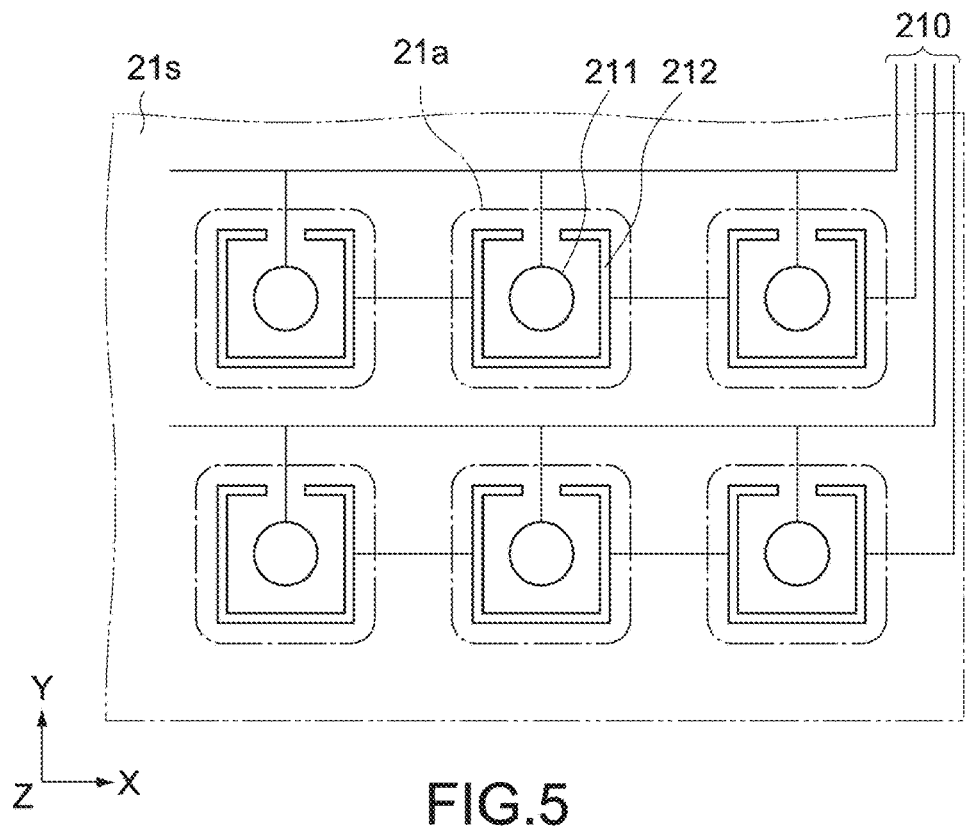
FIG. 5 A main-part plan view of a first wiring board in the electrode substrate.
Figure 6:
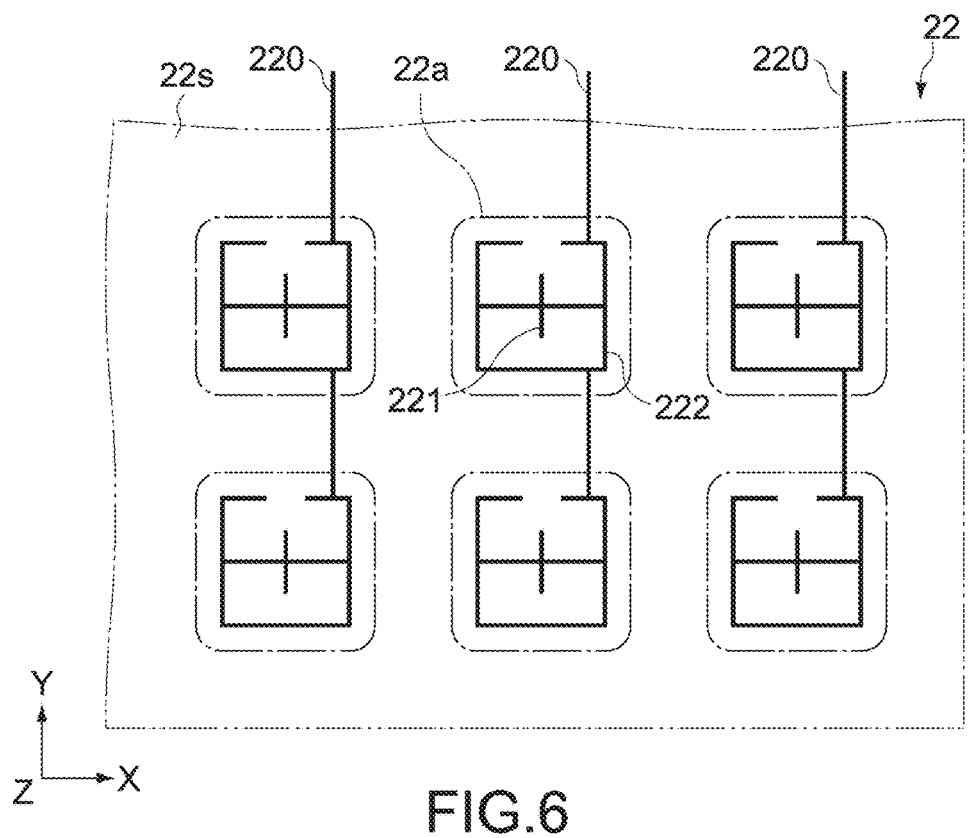
FIG. 6 A main-part plan view of a second wiring board in the electrode substrate.

The electrode substrate 20 has a laminated structure of a first wiring board 21 and a second wiring board 22. FIG. 4 is a main-part plan view showing the configuration of the electrode substrate 20. FIG. 5 is a main-part plan view of the first wiring board 21. FIG. 6 is a main-part plan view of the second wiring board 22.

The first wiring board 21 includes a first base material 21s formed of an insulation plastic sheet and a plurality of first electrode wires 210 formed on the first base material 21s.

The plurality of first electrode wires 210 each include a first electrode section 211 and a second electrode section 212. The first and second electrode sections 211, 212 are arranged in a plurality of detection regions 21a corresponding the plurality of key regions 10a, respectively. In this embodiment, the first electrode section 211 is located in a center portion of each detection region 21a and the second electrode section 212 is located in a circumferential portion of each detection region 21a.

The first electrode wires 210 are formed connecting the detection regions 21a in respective columns along an X-axis direction to one another in the X-axis direction. The first electrode section 211 and the second electrode section 212 are formed of independent electrode wires (first electrode wires 210), respectively.

On the other hand, the second wiring board 22 includes a second base material 22s formed of an insulation plastic sheet and a plurality of second electrode wires 220 formed on the second base material 22s.

The plurality of second electrode wires 220 each include a first electrode section 221 and a second electrode section 222. The first and second electrode sections 221, 222 are arranged in a plurality of detection regions 22a corresponding to the plurality of key regions 10a. In this embodiment, the first electrode section 221 is located in a center portion of each detection region 22a and the second electrode section 222 is located in a circumferential portion of each detection region 22a.

The second electrode wires 220 are formed connecting the detection regions 22a in the respective columns along the X-axis direction to one another in a Y-axis direction. The first electrode section 221 and the second electrode section 222 are integrally connected to each other in each detection region 22a.

The first base material 21s and the second base material 22s are formed of an electrical insulation plastic sheet, glass substrate, glass epoxy substrate, or the like of PET, PEN, PC, PMMA, or the like. The thickness of the first base material 21s and the second base material 22s is not particularly limited and is, for example, several tens μm to several hundreds μm. The first base material 21s and the second base material 22s may be formed of a flexible sheet material or may be formed of an inflexible sheet material.

The first electrode wires 210 and the second electrode wires 220 are respectively formed on the first base material 21s and the second base material 22s by, for example, etching of a metal foil of Al, Cu, or the like or printing of a metal paste of Ag (silver) or the like.

The first wiring board 21 and the second wiring board 22 may be laminated such that the first and second electrode wires 210, 220 are opposed to each other while sandwiching an adhesive layer (not shown) therebetween or may be laminated such that the first and second electrode wires 210, 220 are opposed to each other while sandwiching at least either one of the first and second base materials 21s, 22s therebetween.

In the electrode substrate 20, the detection regions 21a on the first wiring board 21 and the detection regions 22a on the second wiring board 22 are opposed to each other in a Z-axis direction. In this manner, the detection regions 21a on the first wiring board 21 and the detection regions 22a on the second wiring board 22 form a plurality of detection regions 20a of the electrode substrate 20 that are arranged opposed to the plurality of key regions 10a.

As shown in FIG. 4, the first electrode sections 211 of the first electrode wires 210 and the first electrode sections 221 of the second electrode wires 220 are opposed to each other in the Z-axis direction. With this, first capacitive elements (capacitive sensors) C1 of the electrode substrate 20 are formed. Similarly, the second electrode sections 212 of the first electrode wires 210 and the second electrode sections 222 of the second electrode wires 220 are opposed to each other in the Z-axis direction. With this, second capacitive elements (capacitive sensors) C2 of the electrode substrate 20 are formed.

The first and second capacitive elements C1, C2 have initial capacitances set in advance. The capacitances of the capacitive elements C1, C2 change depending on distances from the key region 10a (conductor layer 12) opposed to them. As will be described later, the electrode substrate 20 is electrically connected to a control unit 60. Thus, the change of the distance between any of the key regions 10a and the detection region 20a opposed thereto is detected on the basis of the amount of capacitance change of the capacitive elements C1, C2. In this manner, the electrode substrate 20 is configured to be capable of electrostatically detecting the change of the distance from each of the plurality of key regions 10a.

In this embodiment, the first capacitive element C1 is provided opposed to a center portion of each of the plurality of key regions 10a and the second capacitive element C2 is provided opposed to a circumferential portion of each of the plurality of key regions 10a.

(Support)

The support 30 is provided between the operation member 10 and the electrode substrate 20. The support 30 includes the plurality of structures 31 (first structure) and the space 32 (first space). The plurality of structures 31 connect between the electrode substrate 20 and the operation member 10. The space 32 is formed among the plurality of structures 31 and configured to be capable of changing the distance between each of the plurality of key regions 10a and the electrode substrate 20 according to an input operation.

In this embodiment, the support 30 further includes a base material 33 that supports the structures 31. The base material 33 is formed of an electrical insulation plastic sheet of PET, PEN, PC, or the like. The base material 33 is laminated on the second wiring board 22 of the electrode substrate 20. The thickness of the base material 33 is not particularly limited and is, for example, several μm to several hundreds μm.

The plurality of structures 31 have the same height (e.g., several μm to several hundreds μm). The plurality of structures 31 connect between the electrode substrate 20 and the operation member 10 so as to partition the key regions 10a of the operation member 10 (the detection regions 20a of the electrode substrate 20).

In view of an improvement of the operability (click feeling and stroke feeling) and the detection sensitivity of each key region 10a, each of the structures 31 is formed of a material having relatively high rigidity. However, each of the structures 31 may be formed of an elastic material. Each of the structures 31 is formed of, for example, an electrical insulation resin material such as an ultraviolet curable resin. Each of the structures 31 is formed on the surface of the base material 33 by using a suitable method such as a transfer method.

The space 32 is configured to be capable of partially elastically deforming the operation member 10 toward the electrode substrate 20 in each of the key regions 10a. Although the space 32 is formed to mutually communicate with the plurality of key regions 10a, it is not limited thereto. The space 32 may be independently provided in each of the key regions 10a.

(Control Unit)

The input apparatus 1 of this embodiment further includes the control unit 60. The control unit 60 is electrically connected to the electrode substrate 20 and configured to generate, on the basis of outputs of the first capacitive element C1 and the second capacitive element C2, information on an input operation with respect to each of the plurality of key regions 10a.

The control unit 60 is typically formed of a computer including a CPU/MPU, a memory, and the like. The control unit 60 may be formed of a single chip component or may be formed of a plurality of circuit components. The control unit 60 may be installed in the input apparatus 1 or may be installed in an apparatus main body (processing apparatus) connected to the input apparatus 1. In the former case, for example, the control unit 60 is mounted on a flexible wiring board connected to the electrode substrate 20. In the latter case, the control unit 60 may be integrally configured with a controller that controls the apparatus main body.

The control unit 60 includes a storage unit and an arithmetic unit. The storage unit stores key layout information of the operation member 10. The arithmetic unit executes input determination on the plurality of key regions 10a on the basis of the key layout information stored in the storage unit and the outputs of the first and second capacitive elements C1, C2 in each of the detection regions 20a. Typically, the control unit 60 sets thresholds corresponding to the amount of capacitance change of the first and second capacitive elements C1, C2 and performs a key input determination based on its level compared with the thresholds.

For example, the control unit 60 is configured to output an input signal if the amount of capacitance change of the first capacitive element C1 is above a first threshold and the amount of capacitance change of the second capacitive element C2 is above a second threshold smaller than the first threshold.

The control unit 60 is configured to output an input signal if a difference between the amount of capacitance change of the first capacitive element C1 and the amount of capacitance change of the second capacitive element C2 is above a predetermined threshold.

The control unit 60 is configured to output an input signal if the amount of capacitance change of the first capacitive element C1 is above a first predetermined value and a time rate of change of capacitance of the first capacitive element C1 is above a second predetermined value.

The storage unit may be configured to be capable of storing key layout information of a plurality of types of operation members including the plurality of key regions 10a in different layouts. With this, it becomes possible to determine a suitable input operation also with respect to the plurality of operation members in different key layouts.

The arithmetic unit is configured to generate a control signal varying depending on the amount of capacitance change of the first and second capacitive elements C1, C2 in at least one detection region 20a of the plurality of detection regions 20a. With this, it becomes possible to perform not only on/off determination of the key region 10a but also determination as to the presence/absence, operating force, or the like of a touch operation with respect to the key region 10a.

The arithmetic unit may be configured to generate a control signal if the amount of capacitance change of the first and second capacitive elements C1, C2 in at least one detection region 20a of the plurality of detection regions 20a is equal to or larger than a predetermined value. In this configuration, the control signal is output to the apparatus main body (processing apparatus) only when an operation requiring control is performed. Thus, the amount of processing of signals in the apparatus main body can be reduced.

Action of This Embodiment (Basic Operation)

The keyboard widely used as a key input apparatus enables a favorable and stable key input to be performed by using a depression (stroke) in pressing the key with a predetermined finger and a sense (click feeling) in pressing the key. For that reason, the keyboard is a widely used input apparatus.

For example, in a mechanical keyboard 110 shown in FIG. 7, a plurality of substantially plate-like keys 101 movable in upper and lower directions and upper and lower conductive layers 102, 103 below each of them are arranged. The mechanical keyboard 110 has a structure that the key 101 is pressed with a desired force to bring the upper and lower conductive layers 102, 103 into contact with each other for obtaining a switch-on state. Such a structure imposes a limitation on fabrication of a thin keyboard. In recent years, a thin keyboard or the like using a resistance change material between the upper and lower conductive layers has also been proposed.

In addition, a key input apparatus with a touch panel is more and more popular. In the key input apparatus, a screen keyboard is displayed on a part of the screen and character inputs are performed by touching the screen. In this system, the consistency of coordinates of the touch panel and a key region displayed on the screen is calculated, and if it is determined that the finger or the like has touched a predetermined key region, it is determined that a key input is performed.

However, unlike the above-mentioned keyboard 110, an operator cannot place the finger on the key in the screen. In other words, the operator always needs to perform a key input by touching a desired key region with the finger from a state in which the operator separates the finger therefrom. Further, the stroke feeling and click feeling as in the above-mentioned mechanical keyboard cannot be provided. Thus, it is disadvantageous in that it is not suitable for high-speed inputs. In addition, except for special cases, widely used capacitive touch panels have characteristics in that they cannot receive inputs through a glove and the like and hardly react touches of minute portions such as a distal edge of a nail. Such characteristics significantly deteriorates the operability of the key inputs.

In contrast, the input apparatus 1 of this embodiment has the following characteristics, for example.

(1) The input apparatus 1 of this embodiment functions to detect the change of the distance between the conductor layer 12 and the electrode substrate 20 provided on the back of the key region 10a as the change of capacitance of the capacitive sensors (first and second capacitive elements C1, C2). Therefore, with respect to a manipulation operation, in addition to the binary determination of on/off, it is possible to detect the change of the distance between the conductor layer 12 and the electrode substrate 20 on the basis of the change of capacitance of the capacitive sensors due to local deformation of the operation member 10 (key region 10a) depending on an operating force. With this, by setting thresholds corresponding to the amount of capacitance change, the key input determination can be performed based on its level compared with the thresholds.

Figure 7:
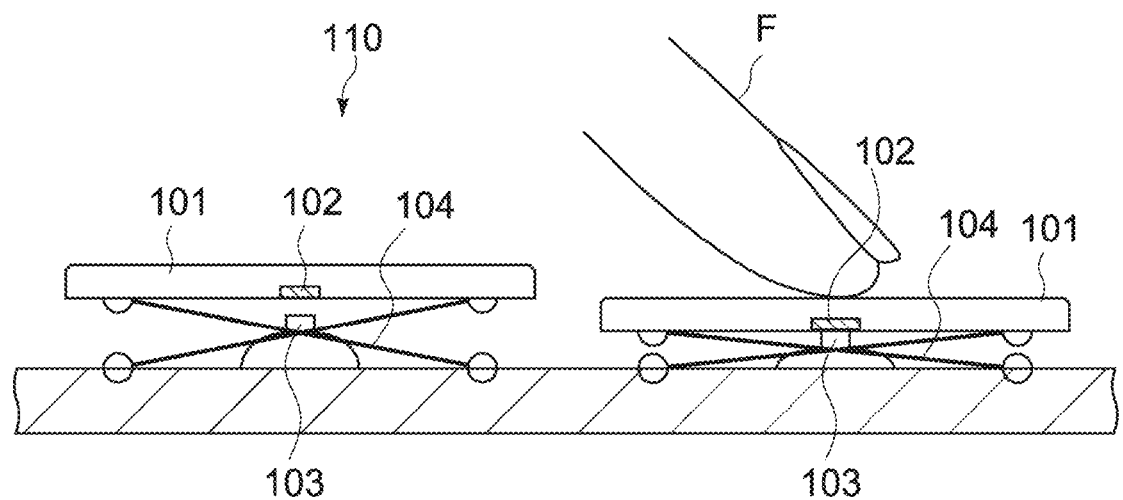
FIG. 7 A cross-sectional view explaining a configuration example of the input apparatus.

Although, for example, the sensitivity of the on/off operation load depends on the device properties in the keyboard 110 as shown in FIG. 7, the operation sensitivity can be set by the values of the thresholds in the input apparatus 1 of this embodiment. In addition, an input apparatus can be formed of a single device having a plurality of performance operation load sensitivities. It means that, in addition to freely setting the operation load, even the key input apparatus can perform various types of detection such as coordinate detection using gravity center calculation and load-amount detection.

On the other hand, the key input apparatus with the touch panel has to be operated by the finger separated therefrom as described above. In contrast, in this embodiment, a threshold corresponding to the amount of capacitance change depending on an operation load during operation is used, and hence, even when the finger touches the key region 10a, the key input is not achieved as long as the load at this time is equal to or smaller than the set threshold. This allows the operator to perform an input operation while placing the finger on the key region 10a.

(2) The input apparatus 1 of this embodiment includes the conductor layer 12 on the surface opposed to the electrode substrate 20 of the operation member 10. Therefore, unlike a typical touch sensor that detects capacitive coupling between the finger and the capacitive sensor, the input apparatus 1 is capable of detecting an input operation based on the change of the distance between the conductor layer 12 and the electrode substrate 20. Therefore, even when an input is performed by the distal edge of the nail or the finger wearing the glove, the conductor layer 12 causes desired deformation. Thus, an input operation by the use of the non-conductive operation element can be performed.

(3) The input apparatus 1 of this embodiment uses the thresholds of the amount of capacitance change for detecting an input operation, and hence can also partially use the gravity center calculation. This principle may be used to allow a single capacitive sensor (first and second capacitive elements C1, C2) to be adapted for various types of key layouts. For example, the layout of a general keyboard is slightly different between Japan and the United States, European countries, or the like. In the past, it was necessary to change all the components for the key layout differences. In this embodiment, at least the sensor section (electrode substrate 20) can be commonly used. That is, a plurality of types of key tops constituting a desired key layout can use the common capacitive sensor. In this case, a key determination program complying with the types of key tops only needs to be prepared.

(4) The input apparatus 1 of this embodiment basically performs detection by the use of the N*M=S number of capacitive sensors using a combination of N and M sensor channels. The number of S may be larger than the number of necessary keys. Alternatively, for example, two or more capacitive sensors may be assigned for a key larger than a typical key size, for example, a "Space" key, "Enter" key, or "Shift" key. Further, for a region in which the key positions are slightly different depending on the individual key layouts for the purpose of allowing them to be adapted for the plurality of key layouts, it is possible to set the position and number of sensors such that an accurate key determination can be performed in each of the key layouts.

Due to the four characteristics described above, the input apparatus 1 of this embodiment has the following advantages, for example.

[1] According to this embodiment, the operation member 10, the electrode substrate 20, and the support 30 are basically formed of a laminate of thin film materials, and hence the entire input apparatus 1 can be thin.

[2] According to this embodiment, the key determination is performed based on the change of the distance between the operation member 10 and the electrode substrate 20, using the support 30 including the space 32, and hence it is possible to identify the touch and switch. Further, the threshold of the switch at this time can be freely set by changing parameters of the program, and hence the switch load sensitivity of the input apparatus can be easily changed. In addition, customizing, for example, changing the load sensitivity of a particular key can be easily performed.

[3] According to this embodiment, even a minute load operation causes a change of capacitance in the electrode substrate 20, and hence information being operated can be obtained even if it is equal to or smaller than the threshold of the switch-on determination. With this, an input using a gesture motion or the like becomes also possible.

[4] According to this embodiment, the capacitive sensors can be arranged according to the key layout. Regarding the differences of the key layouts, the common electrode substrate 20 can be used by selecting a program.

[5] According to this embodiment, the key input instruction is carried out when the amount of capacitance change equivalent to the key input is detected. However, even if no change of capacitance equivalent to the key input is caused, it is possible to generate data on the change of capacitance. Using the data on the minute change of capacitance, for example, it is possible to display information on a key as a press target on the screen, issue sound immediately before the key input, or change the size of the display. With this, a new usability can be realized.

Action of This Embodiment

In the keyboard 110 shown in FIG. 7, the operation surface of the keys 101 is moved in a direction substantially parallel to a press direction substantially without bending deformation in response to an operating force. The key operation surface is supported by an elastic body 104 having a predetermined spring constant, and hence the amount of movement of the key 101 depends on a relationship between the load during operation and the spring constant supporting the key operation surface. The variation of the amount of movement due to the position in the key region and the area is designed to be reduced.

Figure 8:
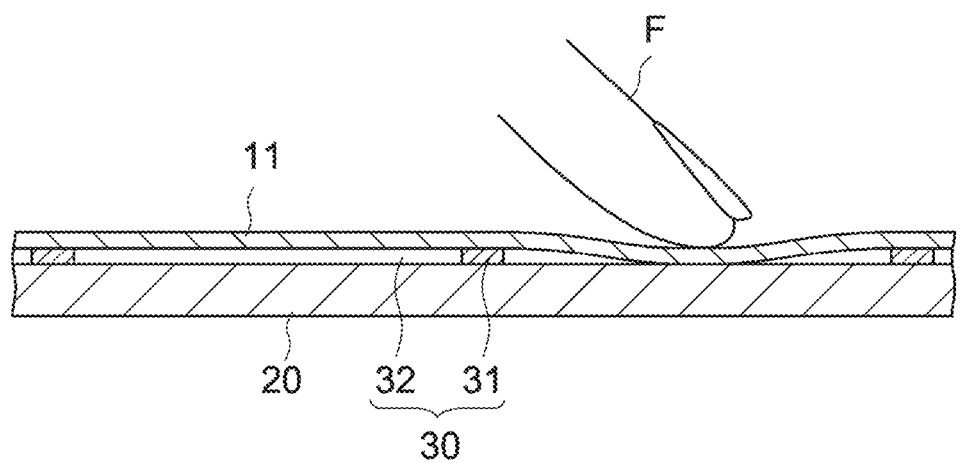
FIG. 8 A cross-sectional view explaining another configuration example of the input apparatus.
Figure 9:
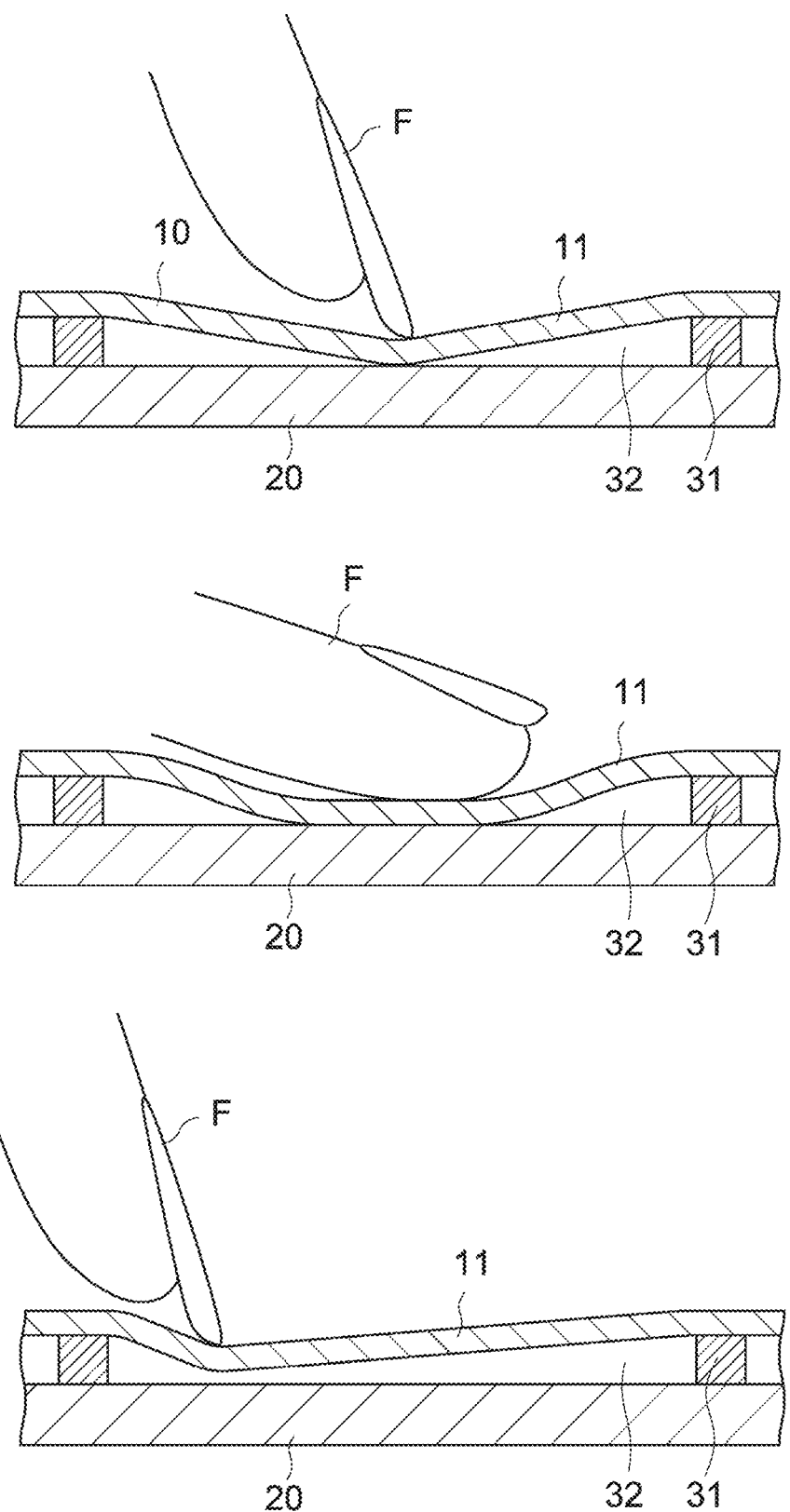
FIG. 9 A diagram explaining the action of the input apparatus shown in FIG. 8.

On the other hand, in this embodiment, the key operation surface itself is also formed of a thin member (operation member 10). Therefore, with respect to the input apparatus such as the general keyboard, the key operation surface easily causes the bending deformation due to the operation load as shown in FIG. 8. Therefore, as each shown in the upper, middle, and lower sections of FIG. 9, the bending state largely varies depending on the operation position and operation area. Consequently, a variation of the amount of movement of the key operation surface easily occurs. In this embodiment, the key determination is performed based on the level of the amount of capacitance change due to the amount of movement of the key operation surface, and hence the variation of the amount of movement of the key operation surface directly leads to the variation of the key determination. For example, when the center portion of the key is pressed, the key is turned on with a small operating force. Meanwhile, when a portion near the corner of the key is pressed, a larger operation load is required. Due to such a variation, various inconveniences can occur. For example, it can be difficult to turn on the key in some key press positions during input. Further, the key can be unintentionally turned on while a motion of searching for a key in touch typing is performed. Thus, it is difficult to optimize the key determination.

In order to overcome the above-mentioned problems, in this embodiment, the following countermeasures for the operation member 10, the electrode substrate 20, and the control unit 60 are carried out. Countermeasure Examples <1> to <4> below may be separately adopted or a combination of two or more countermeasure examples may be adopted.

<1> Reduce the variation of a bending deformation amount with respect to the position and area of the operation load.

<2> Provide a plurality of capacitance detection sensors and arrange them by separating the capacitive sensors into a portion with a large bending deformation amount and a portion with a small bending deformation amount.

<3> Arrange the plurality of capacitive sensors in a single key area and determine the switch-on in view of a predetermined calculation of a value detected by each of the capacitive sensors.

<4> Determine the switch-on by adding a determination criteria of a capacitance change speed associated with a key press speed.

Countermeasure Example <1>

Figure 10:
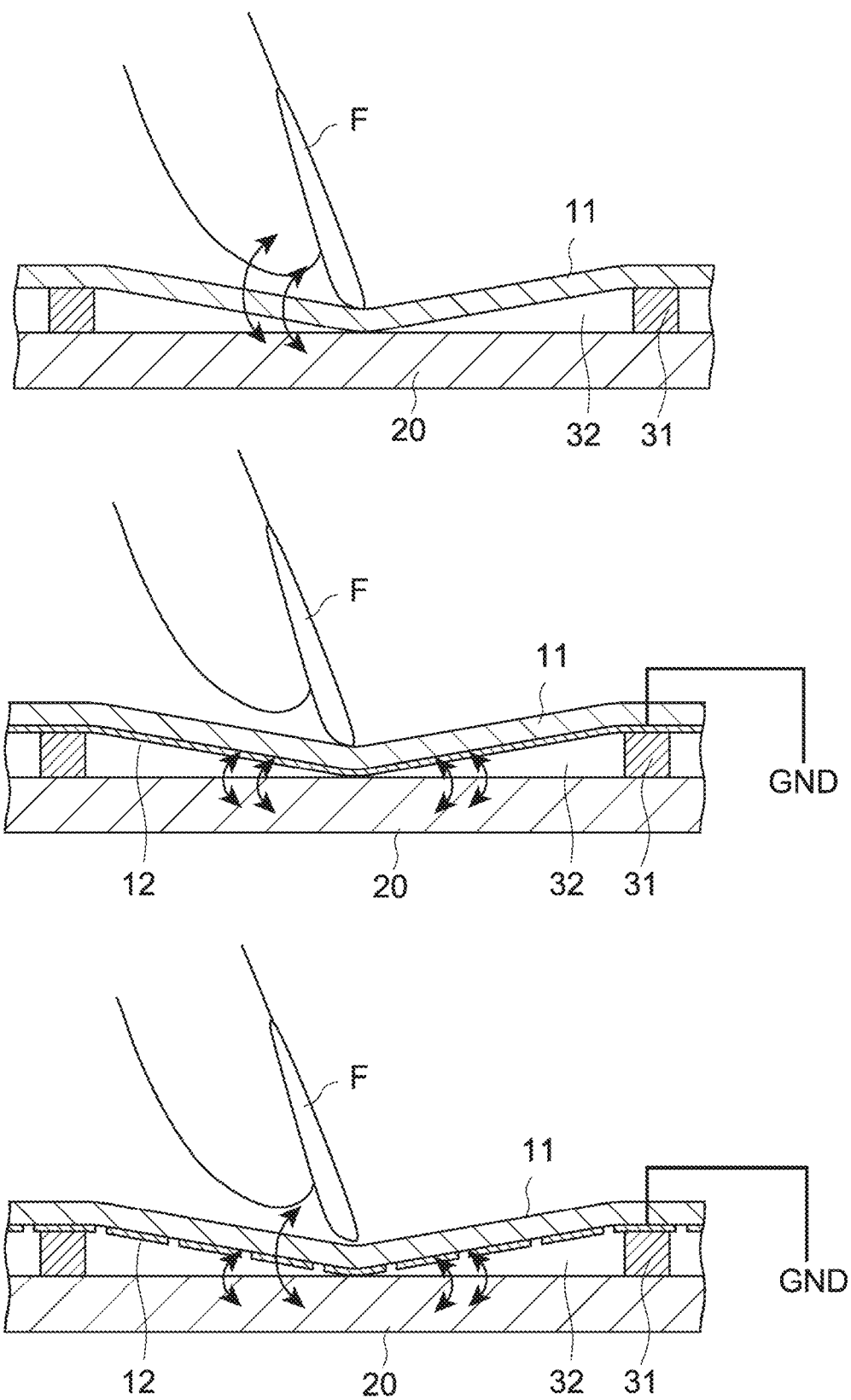
FIG. 10 A diagram explaining the action of the input apparatus shown in FIG. 8.

FIG. 10 shows a detection example of a key operation state. In the example shown in the upper section of FIG. 10, the change of capacitance when a conductor such as a finger F approaches the capacitive sensor (electrode substrate 20) is detected. In the example shown in the middle section of FIG. 10, the change of capacitance when the conductor layer 12 of a key operation film pressed by the finger F approaches the capacitive sensor (electrode substrate 20) is detected. In the example shown in the lower section of FIG. 10, the change of capacitance when the finger F and the mesh conductor layer 12 approach the capacitive sensor (electrode substrate 20) is detected.

In the example shown in FIG. 10, deformation due to the operating force occurs only in the key operation surface. In the case of such a deformation structure, a structure example for reducing the variation of the bending deformation of the key operation surface will be explained below.

Figure 11:
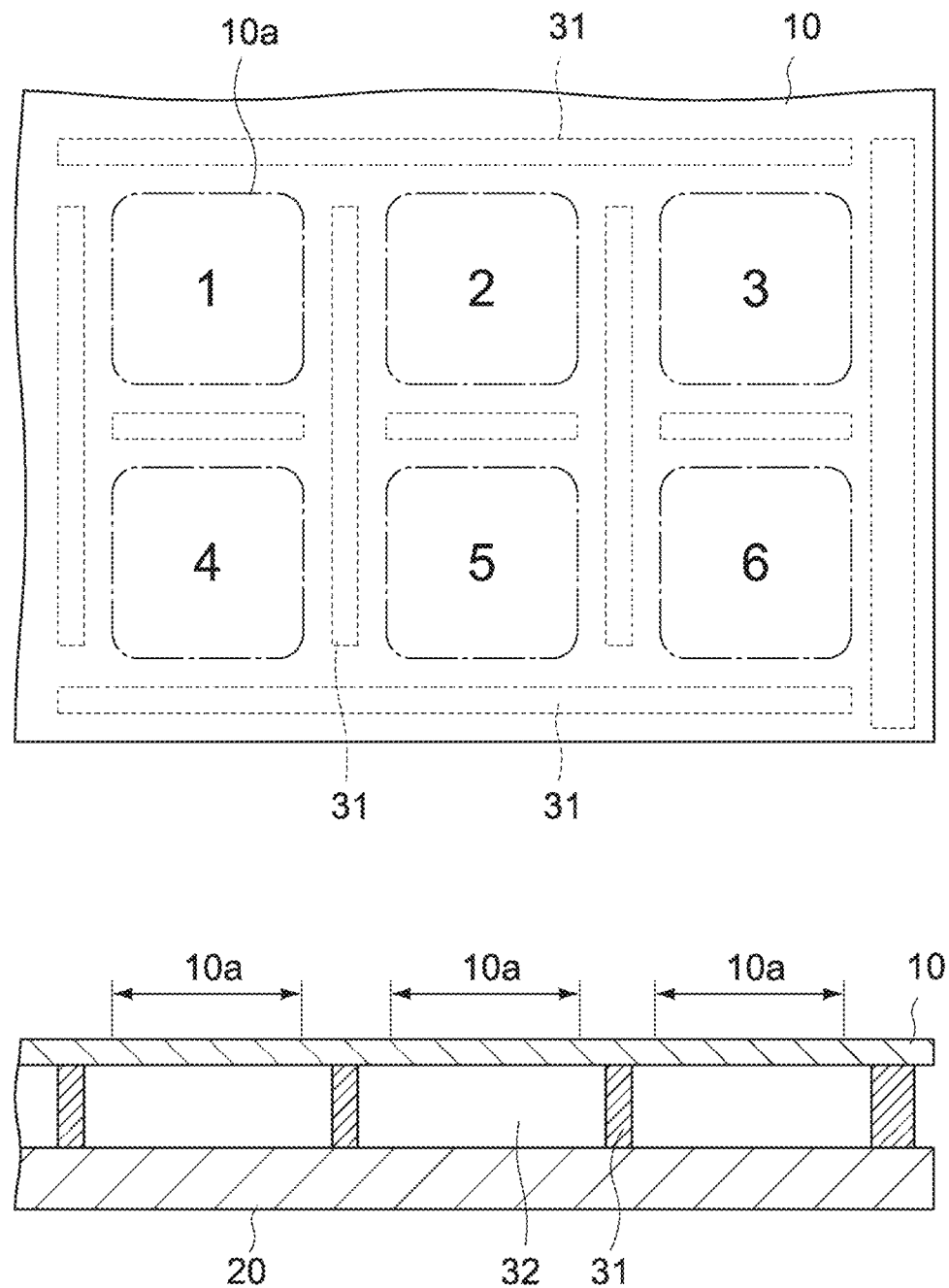
FIG. 11 Main-part plan view and cross-sectional view showing the configuration of the input apparatus shown in FIG. 1.

The upper section and the lower section of FIG. 11 are a main-part plan view of the key operation surface and a cross-sectional view thereof, respectively. In this embodiment, the support surface of the key operation surface (operation member 10) is configured to be larger than the key region 10a. That is, the plurality of structures 31 of the support 30 are located outside the key region 10a. With this, the difference of the bending deformation amount between the center portion and the circumferential portion of the key region 10a during key operation can be reduced. Therefore, it is possible to suppress the variation of the detection sensitivity and the erroneous detection due to the variation of the key input position.

Figure 12:
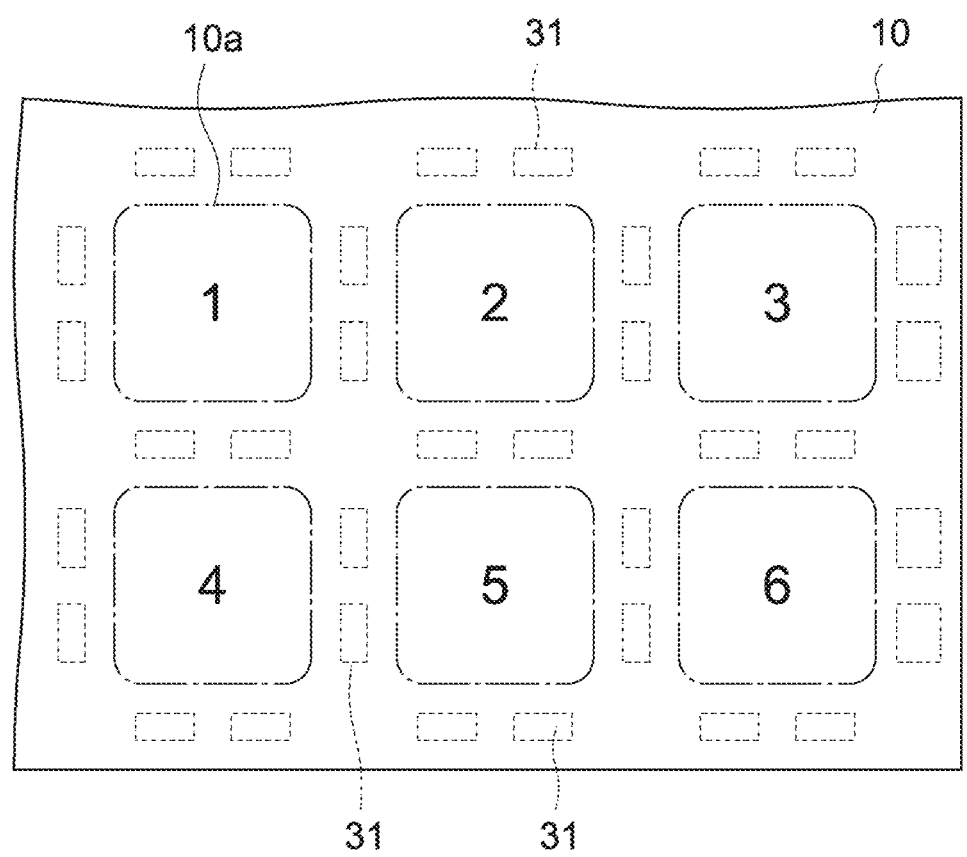
FIG. 12 A main-part plan view showing a modified example of the configuration of the input apparatus.

For making it easy for the user to recognize the key region 10a as the operation region, suitable display may be performed on the key region 10a. Alternatively, the structure 31 may be configured to be divided as shown in FIG. 12.

Figure 13:
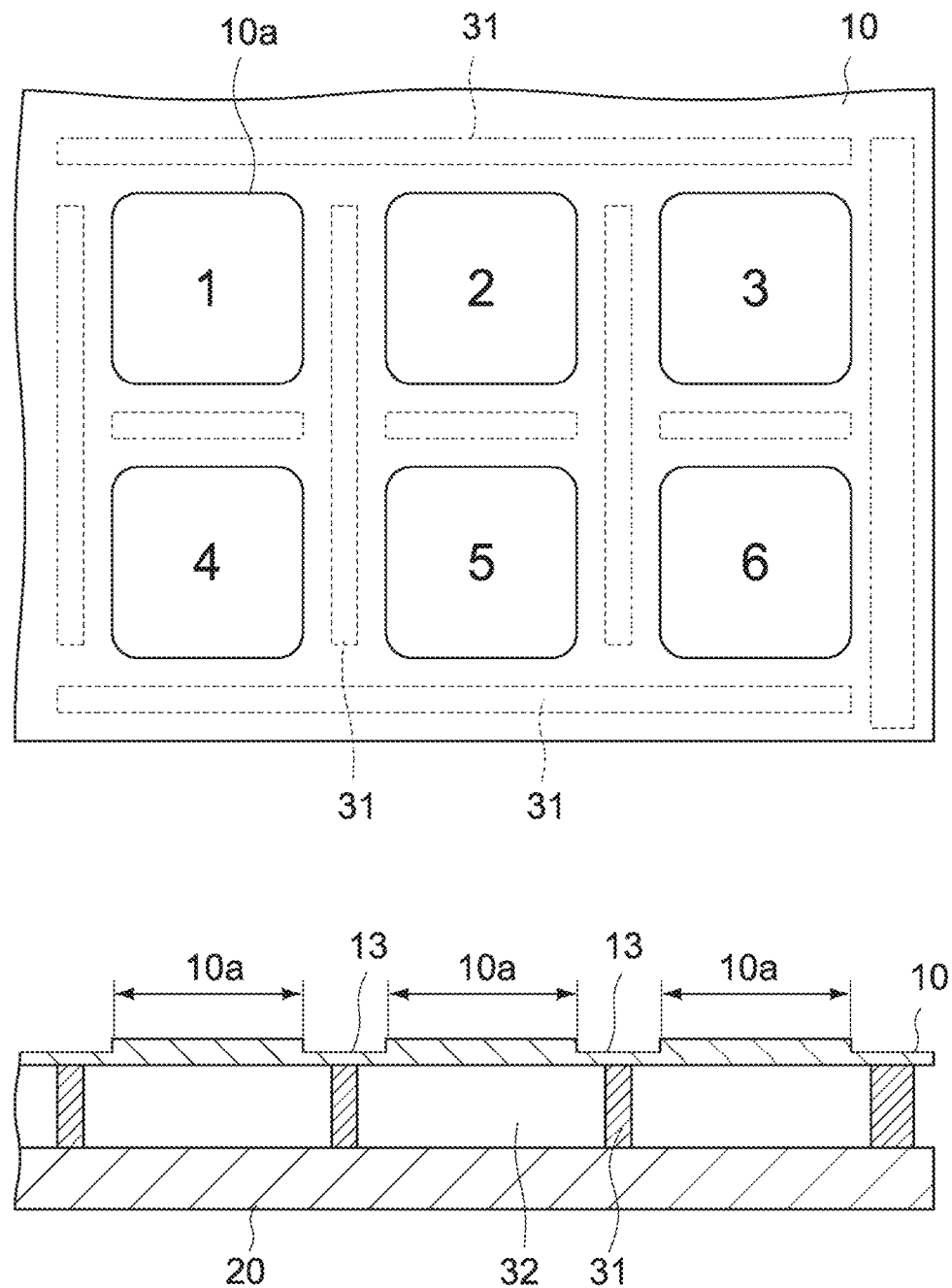
FIG. 13 Main-part plan view and cross-sectional view showing the configuration of the input apparatus shown in FIG. 1.
Figure 14:
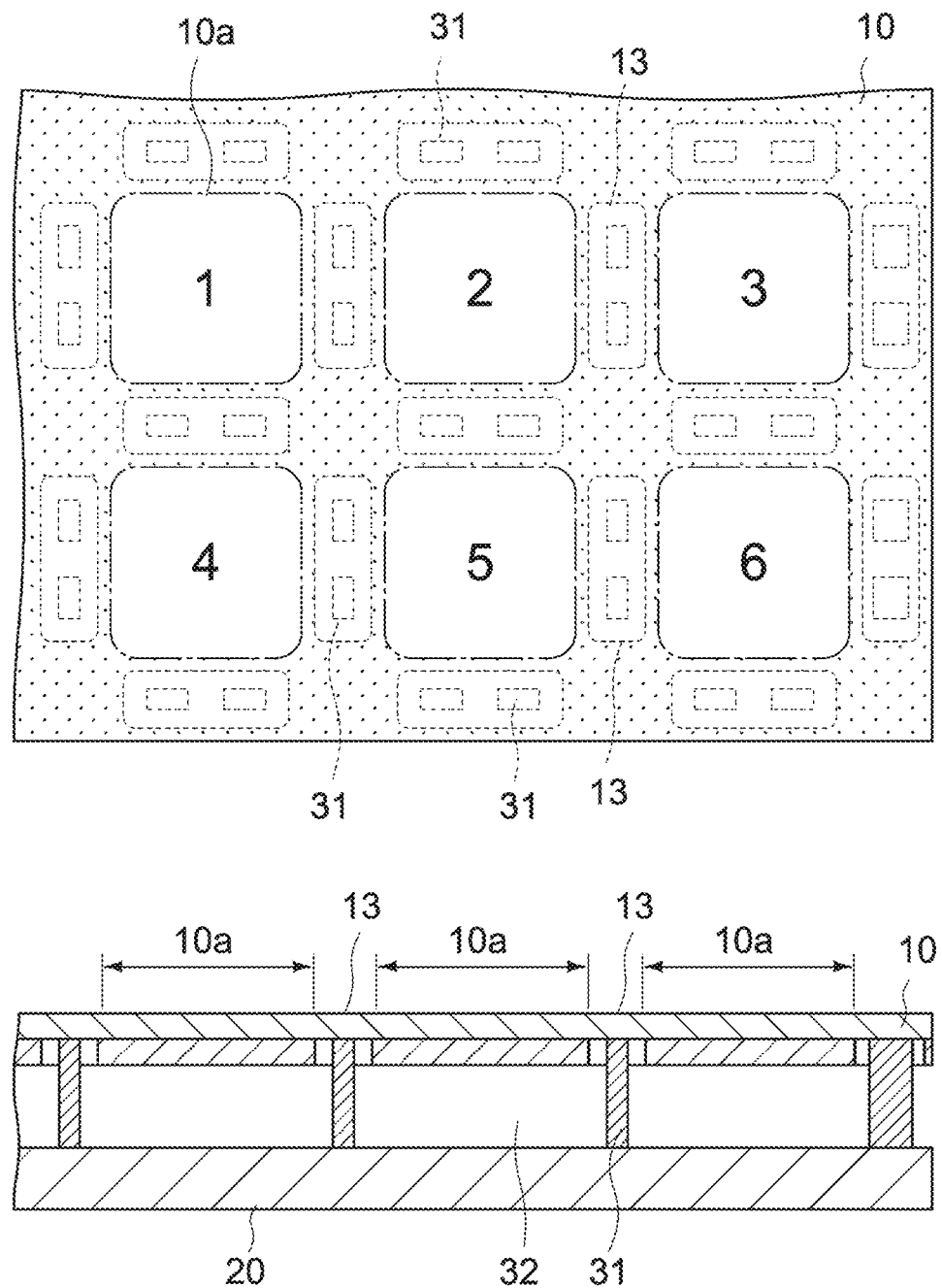
FIG. 14 Main-part plan view and cross-sectional view showing a modified example of the configuration of the input apparatus.

FIGS. 13 and 14 each are a schematic diagram showing a modified example of the configuration of the operation member 10. The upper sections of FIGS. 13 and 14 are main-part plan views of the key operation surface. The lower sections of FIGS. 13 and 14 are cross-sectional views thereof. In these examples, the flexural rigidity of the key region is configured to be higher than the rigidity of the outer peripheral portion of the key region.

That is, in this embodiment, the operation member 10 further includes coupling regions 13 that are supported by the plurality of structures 31 and couple the plurality of key regions 10a to one another. The coupling regions 13 are set to have flexural rigidity lower than that of the plurality of key regions.

In the example shown in FIG. 13, the operation member 10 is configured such that the thickness of the key region 10a is larger than the thickness of the outer peripheral portion (coupling region 13) of the key region 10a. In this manner, by partially changing the flexural rigidity of the key operation surface, it is possible to reduce the amount of bending of the key region 10a1 with respect to the key operation load and make the movement of the key region 10a toward the electrode substrate 20 closer to parallel movement. In addition, the individual key regions 10a are formed protruding from the key operation surface, and hence the user can touch-type. Thus, it is possible to further improve the operability.

Examples of the method of providing the key operation surface with a desired step include a method of freely adding a resin on the key operation surface by printing, a method using transfer molding a UV resin, a method of providing a film with concavo-convex portions by thermally pressing a desired die on a film, and a method using injection molding. In addition, if the operation member 10 is formed of a metal sheet, desired concavo-convex portions can be formed by pressing metal, etching metal, or the like.

On the other hand, in the example shown in FIG. 14, the operation member 10 is configured such that the Young's modulus of the key region 10a is larger than the Young's modulus of the outer peripheral portion (coupling region 13) of the key region 10a. Also with this configuration, it is possible to reduce the amount of bending of the key region 10a with respect to the key operation load and make the movement of the key region 10a toward the electrode substrate 20 closer to the parallel movement. In this example, the arbitrary material layers are laminated on the predetermined regions in the surface opposed to the electrode substrate 20 of the operation member 10, which are not supported by the structures 31. However, the configuration is not limited thereto. The material layers may be laminated directly under at least the individual key regions 10a. Further, the same actions can be obtained also by making certain regions supported by the structure 31 partially thin instead of laminating the other material layers.

Countermeasure Examples <2> and <3>

The detection method for the input operation in this embodiment is detection of the capacitance change in the electrode substrate 20 as described above. The capacitance change due to the deformation when the key is operated is, strictly speaking, a capacitance change due to the change of the distance of a conductive surface (conductor layer 12) that influences the capacitance of the sensor when the key is operated. The basic stance for the electrode arrangement in this embodiment is as follows.

1: Divide the key operation surface into a region to be easily deformed and a region not to be easily deformed when an operating force is applied thereon and arrange the sensor electrodes in the divided regions.

A predetermined determination criteria is added using data on the change of capacitance of the sensor electrodes arranged as in 1 above.

In this embodiment, the first and second capacitive elements C1, C2 are arranged by separating the capacitive sensors in the detection regions 20a of the electrode substrate 20 into a portion with a large bending deformation amount and a portion with a small bending deformation amount of the key region 10a. Hereinafter, the actions of this embodiment will be described as compared with different electrode arrangement examples.

Figure 15:
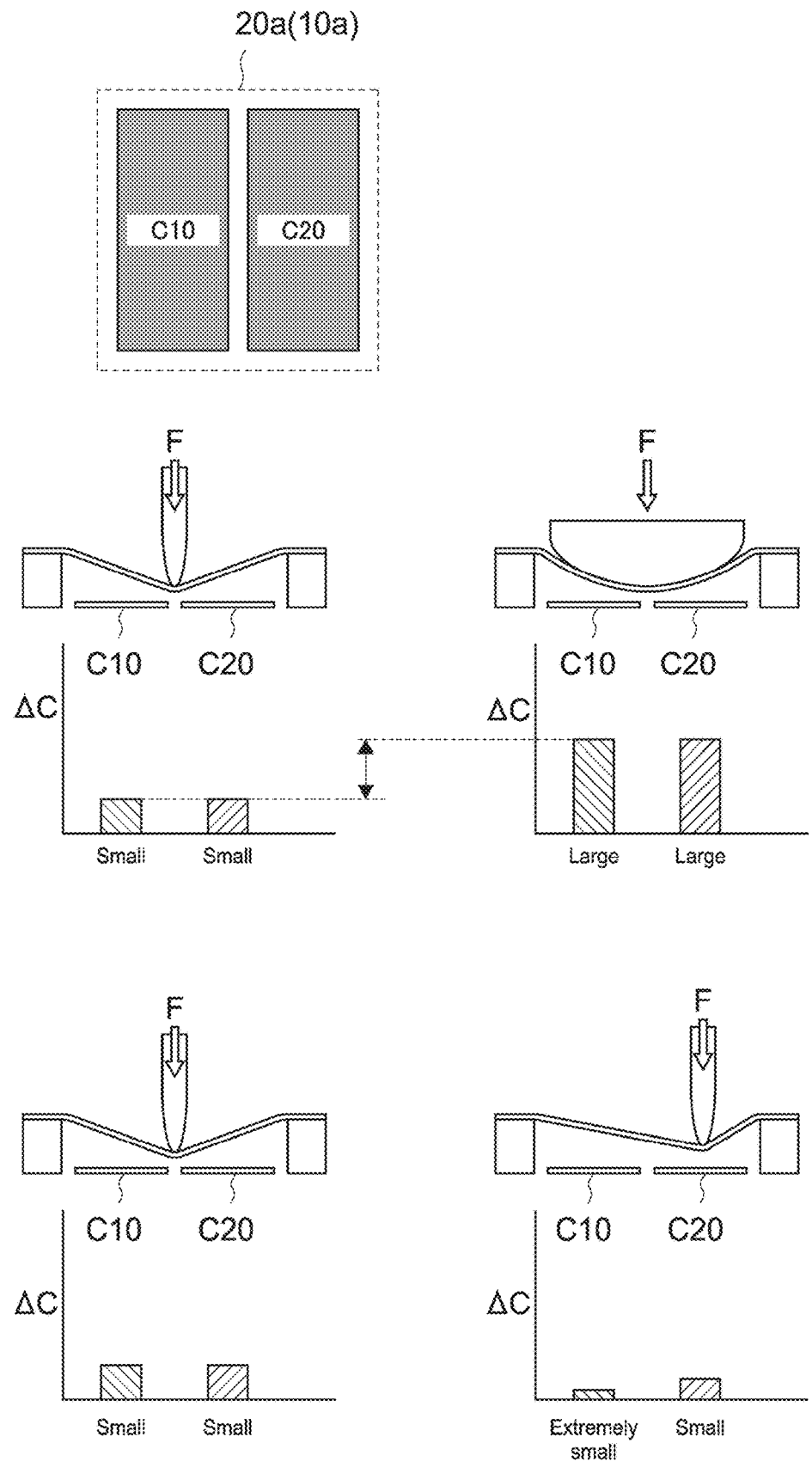
FIG. 15 A diagram explaining the electrode shape of the input apparatus according to the comparison example and the action thereof.

For example, as shown in the upper section of FIG. 15, an electrode arrangement example in which, in the individual detection region 20a (key region 10a), two capacitive sensors C10, C20 are separated and arranged in the left and right is assumed. As shown in the middle left side of FIG. 15, the amount of capacitance change of the capacitive sensors C10, C20 is larger in the case where the center portion of the key region 10a is pressed by the ball of the finger F as shown on the middle right side of FIG. 15 in comparison with the case where the center portion of the key region 10a is pressed by the distal edge of the nail of the finger F. This is based on a difference of opposing areas of the operation member 10 and the capacitive sensors C10, C20 as deformed during key input. Further, as compared with the case where the center portion of the key region 10a is pressed by the distal edge of the nail of the finger F as shown on the lower left side of FIG. 15, the amount of capacitance change of the capacitive sensor C20 is smaller in the case where the circumferential portion of the key region 10a is pressed by the distal edge of the nail of the finger F as shown on the lower right side of FIG. 15. This is based on a difference of the key input position.

Figure 16:
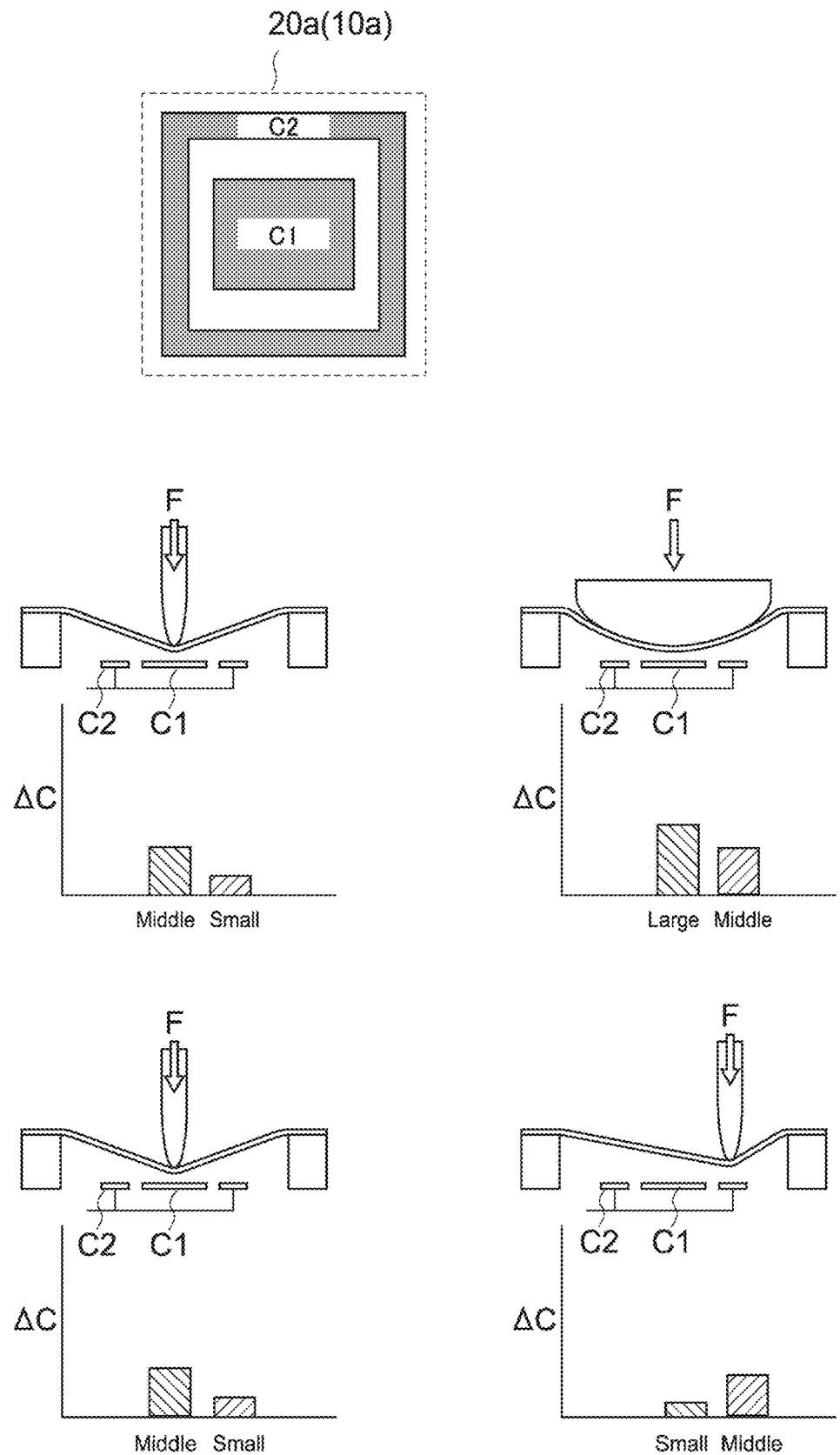
FIG. 16 A diagram explaining the electrode shape of the input apparatus shown in FIG. 1 and the action thereof.

On the other hand, in this embodiment, as shown in the upper section of FIG. 16, the two capacitive sensors C1, C2 are separated and arranged in the center portion and the circumferential portion of the individual detection region 20a (key region 10a). Also in this case, the same as the above-mentioned example is obtained. That is, as compared with the case where the center portion of the key region 10a is pressed by the distal edge of the nail of the finger F as shown on the middle left side of FIG. 16, the amount of capacitance change of the capacitive sensors C1, C2 is larger in the case where the center portion of the key region 10a is pressed by the ball of the finger F as shown on the middle right side of FIG. 16. Further, as compared with the case where the center portion of the key region 10a is pressed by the distal edge of the nail of the finger F as shown on the lower left side of FIG. 16, the amount of capacitance change of the capacitive sensor C2 is smaller in the case where the circumferential portion of the key region 10a is pressed by the distal edge of the nail of the finger F as shown on the lower right side of FIG. 16. This is based on a difference of the key input position.

However, in this embodiment (FIG. 16), the variation of the amount of capacitance change due to the difference of the area and the difference of the position is smaller than that in the comparison example (FIG. 15) and the absolute value of the amount of capacitance change due to the difference of the input position is larger. It can be seen from this that, according to this embodiment, the variation of the detection sensitivity and the erroneous detection due to the input area and the position can be suppressed.

Further, in this embodiment, with a small area, the change of capacitance of the capacitive sensor C1 located in the key center portion occurs and the change of capacitance of the capacitive sensor C2 located outside is smaller. On the other hand, with a large area, the change of capacitance of the capacitive sensor C1 is, of course, larger and at the same time the change of capacitance of the capacitive sensor C2 is also larger. Using such characteristics of the change of capacitance, the following key determination method becomes possible.

Assuming that the amount of capacitance change of the capacitive sensor C1 is denoted by $\Delta C1$ and the amount of capacitance change of the capacitive sensor C2 is denoted by $\Delta C2$, the following example as the determination criteria for input on of the key is conceivable.

$\Delta C1$ (or $\Delta C2$)>S00            Determination Criteria 1

$\Delta C1 - \alpha * \Delta C2 > S01$            Determination Criteria 2

($\alpha$: arbitrary coefficient ($0 < \alpha \leq 1$), S00 and S01: arbitrary key determination constant)

In Determination Criteria 1, if $\Delta C1$ is larger than the predetermined threshold (S00), the switch-on is determined. In Determination Criteria 2, if the difference between $\Delta C1$ and $\Delta C2$ is above the predetermined threshold, the switch-on is determined. In the above-mentioned determination method, the fluctuation due to the area is suppressed using the characteristics that $\Delta C1$ easily fluctuates depending on the operation area and $\Delta C2$ also increases when the operation area increases.

In addition, in the input apparatus 1 of this embodiment, the capacitive sensors C2 arranged around the capacitive sensor C1 are located in the region with a small amount of deformation of the key film. Therefore, the amount of capacitance change $\Delta C2$ of the capacitive sensor C2 when the center portion of the key region 10a is operated is small. In view of this, by configuring the electrode substrate as follows, $\Delta C2$ during key operation may be ensured.

Figure 17:
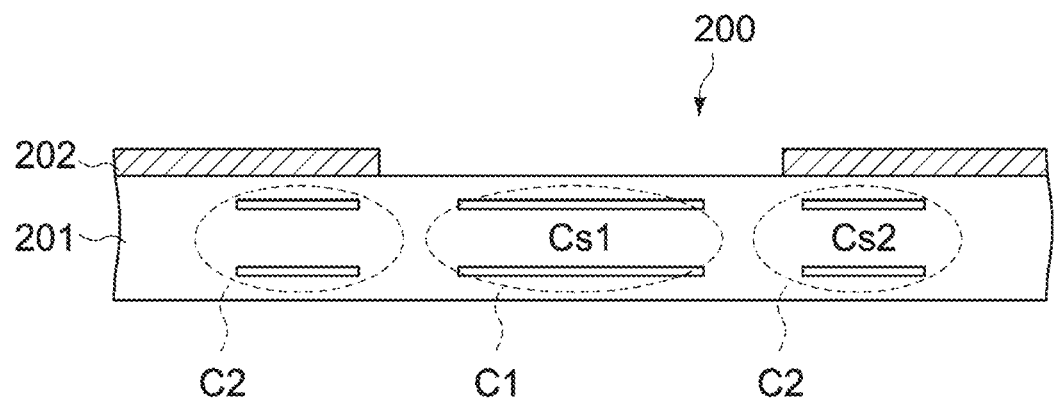
FIG. 17 A cross-sectional view showing another configuration example of the input apparatus shown in FIG. 1.
Figure 17:
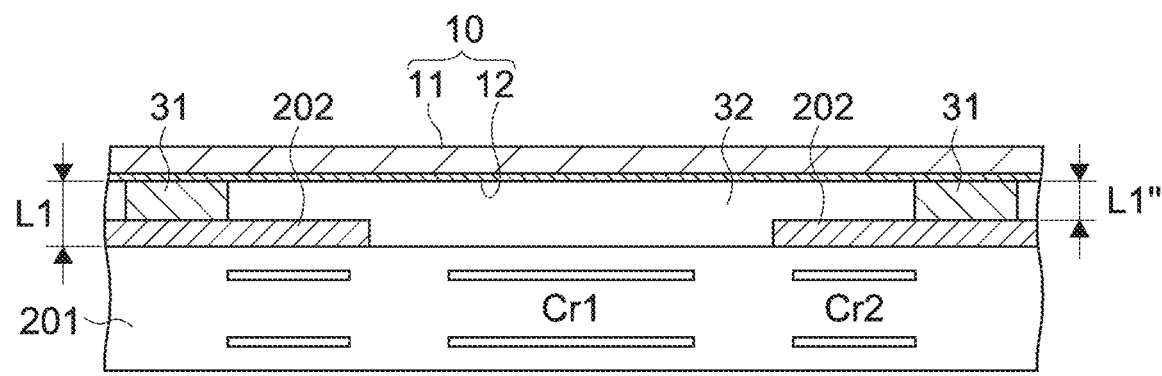
Figure 17:
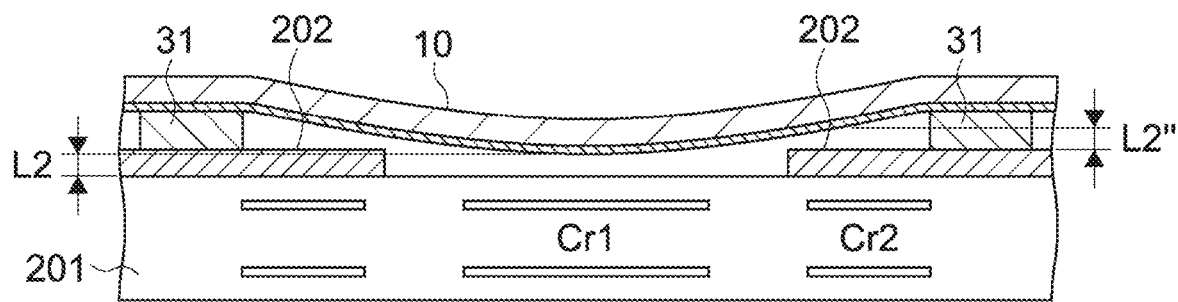

FIG. 17 is a main-part cross-sectional view showing a modified example of the configuration of the electrode substrate. As shown in FIG. 17, an electrode substrate 200 includes a base material laminate 201 incorporating capacitive sensors C1, C2 and a limitation layer 202 formed on a surface of the base material laminate 201. The limitation layer 202 is provided between the capacitive sensors C2 and the operation member 10 and partially limits the thickness of the space 32. The limitation layer 202 is, for example, formed of an insulation material such as a plastic film and an ultraviolet curable resin.

As shown in the upper section of FIG. 17, before the electrode substrate 200 is laminated on the operation member 10, initial capacitances Cs1, Cs2 of the capacitive sensors C1, C2 are set to Cs1<Cs2. In this example, the opposing area of the electrodes constituting the capacitive sensor C2 is formed to be larger than the opposing area of the electrodes constituting the capacitive sensor C1.

As shown in the middle section of FIG. 17, in a state in which the operation member 10 is laminated on the electrode substrate 200 via the structure 31, the capacitive sensor C2 is opposed to the conductor layer 12 via the limitation layer 202. Thus, its coupling with the conductor layer 12 is stronger than coupling between the capacitive sensor C1 and the conductor layer 12. As a result, the capacitance between the electrodes of the capacitive sensor C2 is lowered and the difference between the capacitances Cr1, Cr2 of the capacitive sensors C1, C2 during non-operation becomes smaller.

In this embodiment, for example, the dielectric constant and thickness of the limitation layer 202 are set such that Cr1≈Cr2 is established. More specifically, assuming that the distance by which the capacitive sensor C1 and the conductor layer 12 are opposed to each other during non-operation is denoted by L1, the distance by which the limitation layer 202 and the conductor layer 12 are opposed to each other is denoted by L1" and the distances during operation are denoted by L2, L2", respectively as shown in the lower section of FIG. 17, the dielectric constant and thickness of the limitation layer 202 are set such that L2/L1≈L2"/L1" is established.

With this, even if the amount of deformation of the operation member 10 to which the capacitive sensor C2 is opposed is small, the sensitivity of the capacitive sensor C2 is improved and the variation of the operability due to the difference of the input area and the input position can be suppressed.

(Countermeasure Example <4>)

Figure 18:
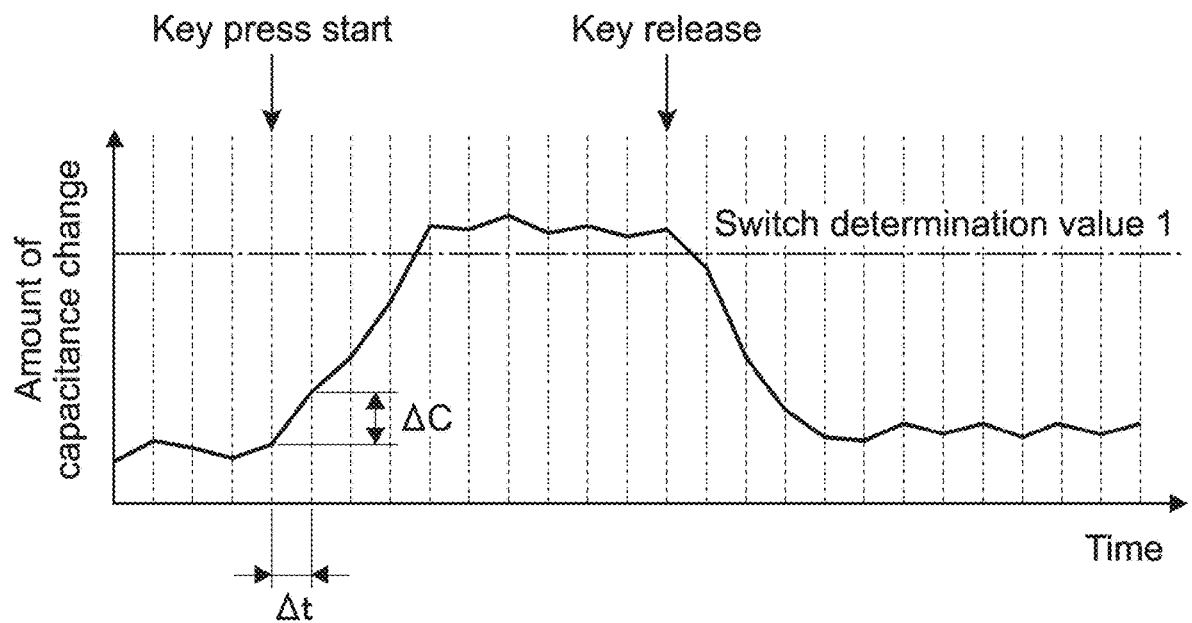
FIG. 18 A diagram explaining a detection method for an input operation using the input apparatus shown in FIG. 1.
Figure 19:
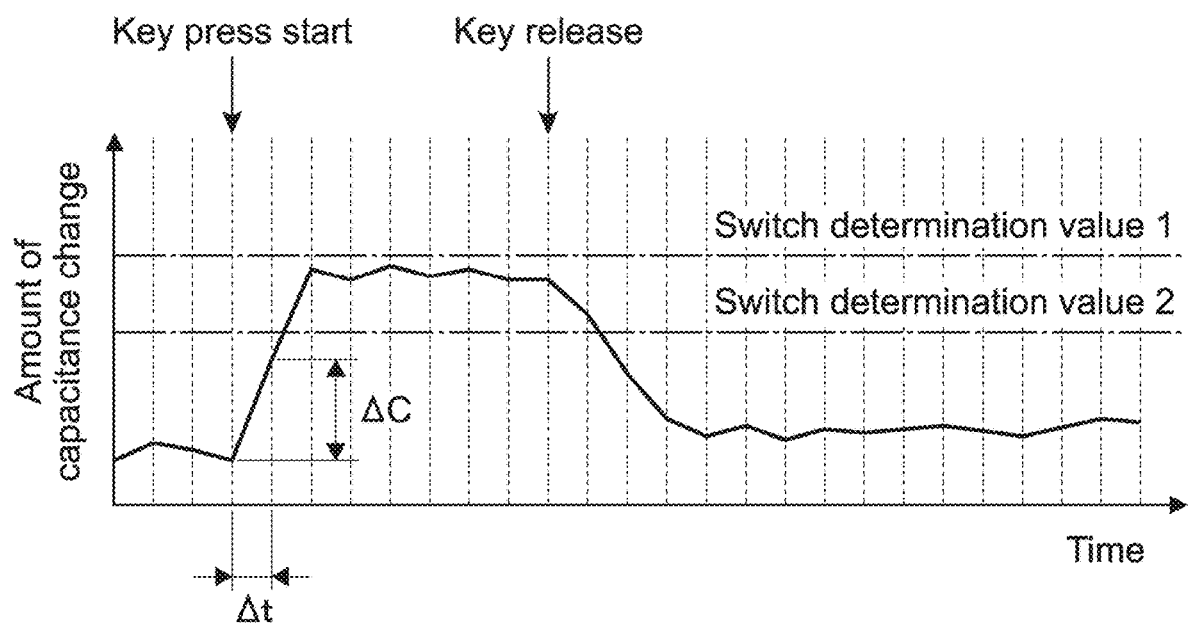
FIG. 19 A diagram explaining the detection method for the input operation using the input apparatus shown in FIG. 1.

FIGS. 18 and 19 are conceptual diagrams showing an example of the change of capacitance of the capacitive sensor over time. The speed of the change of capacitance varies depending on the speed when pressing the key operation surface. Comparing FIG. 18 with FIG. 19, the key press speed is higher in FIG. 19. As a result, a change of capacitance $\Delta C$ with respect to a predetermined time $\Delta t$, that is, speed of $\Delta C$ takes a larger value in FIG. 19. On the other hand, in the case where a switch determination value 1 with respect to the amount of capacitance change is on the dotted line position as in FIGS. 18 and 19, due to the amount of capacitance change, the switch is turned on in FIG. 18 while the switch is not turned on in FIG. 19. In FIG. 19, for example, a motion of hitting the key by the tip of nail with great force is assumed. However, as can be seen from the figure, even if it is difficult to perform the switch-on determination only based on the amount of capacitance change, $\Delta C/\Delta t$ is larger in FIG. 19, and hence the switch-on determination can be performed by adding the speed determination.

In view of this, in this embodiment, the following determination criteria is also used.

Determination Criteria 3: ($\Delta C1/\Delta t$)>D1 and $\Delta C1$>Switch Determination value 2

That is, as shown in FIG. 19, the switch-on is determined if the amount of capacitance change $\Delta C1$ of the capacitive sensor C1 is above "Switch Determination value 2" and the time rate of change ($\Delta C1/\Delta t$) of capacitance of the capacitive sensor C1 is equal to or larger than a predetermined value D1. The same is applicable also to the change of capacitance of the capacitive sensor C2.

Further, for the above-mentioned determination, a plurality of speed thresholds may be set as described above, for example.

($\Delta C1/\Delta t$)>$D1$ and $\Delta C1$>Switch Determination value 2

($\Delta C1/\Delta t$)>$D2$ and $\Delta C1$>Switch Determination value 3

Where D1>D2 and "Switch Determination value 2">"Switch Determination value 3."

Second Embodiment

Figure 20:
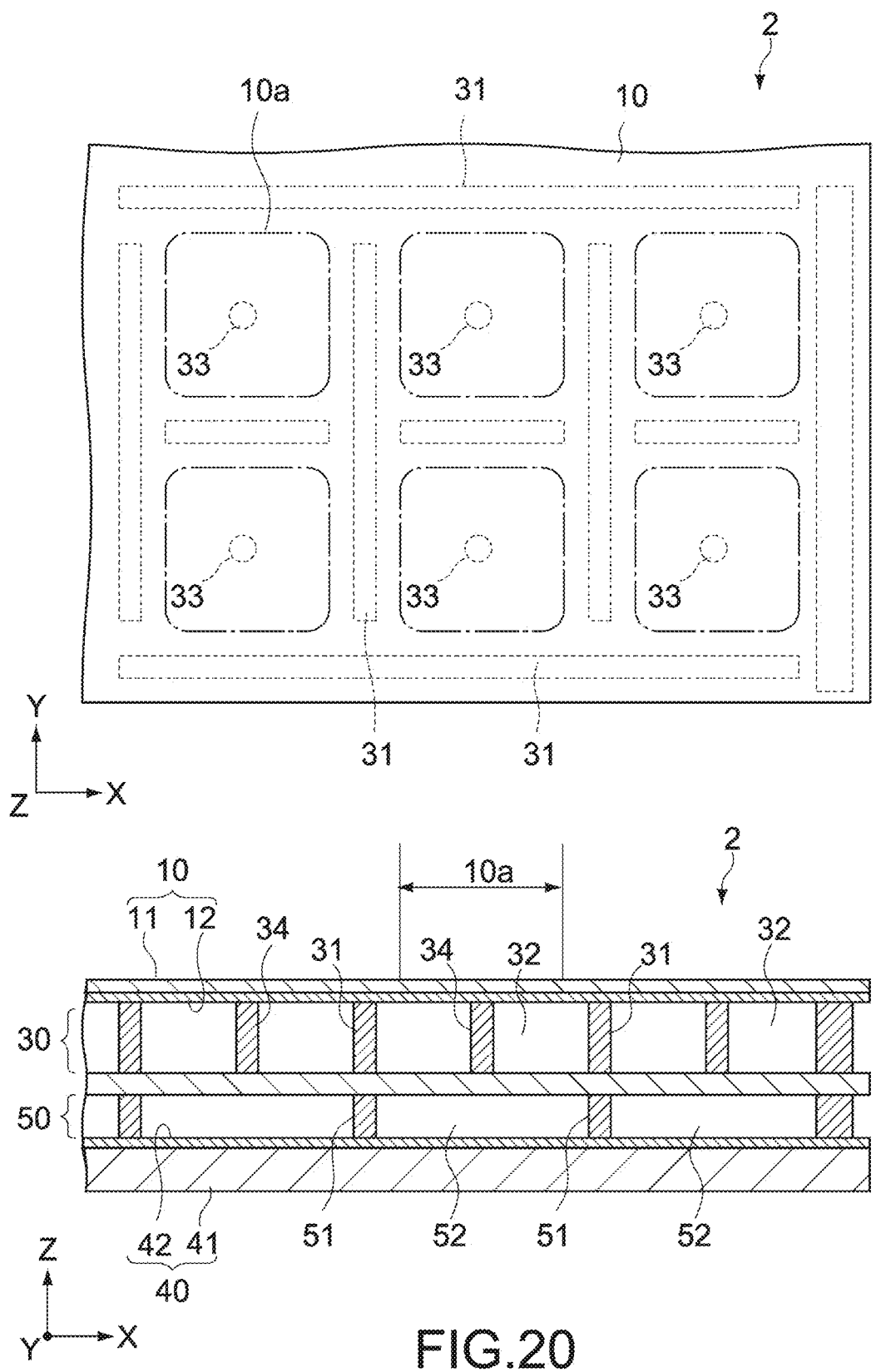
FIG. 20 Main-part plan view and cross-sectional view of an input apparatus according to a second embodiment of the present technology.

FIG. 20 shows an input apparatus according to a second embodiment of the present technology. In the figure, the upper section is a main-part plan view and the lower section is a cross-sectional view thereof. Hereinafter, components different from those of the first embodiment will be mainly described, the same components as the above-mentioned embodiment will be denoted by the same reference symbols, and descriptions thereof will be omitted or simplified.

An input apparatus 2 of this embodiment further includes a base substrate 40 and a second support 50. The base substrate 40 is provided opposed to an operation member 10 while sandwiching an electrode substrate 20 therebetween. A conductor layer 42 is provided on a surface opposed to the electrode substrate 20.

The second support 50 includes a plurality of second structures 51 and a second space 52. The plurality of second structures 51 connect between the electrode substrate 20 and the base substrate 40 and are respectively opposed to a plurality of first structures 31 while sandwiching the electrode substrate 20 therebetween. The second space 52 is formed between the plurality of second structures 51 and configured to be capable of changing the distance between the electrode substrate 20 and the base substrate 40 according to an input operation.

In this embodiment, the first supports 31 further include a plurality of the columnar bodies 34 (third structure) that connect between the electrode substrate 20 and the operation member 10 and are provided in the first space 32.

The base substrate 40 has a laminated structure of a base material 41 and the conductor layer 42. The base material 41 and the conductor layer 42 are configured in the same manner as the base material 11 and the conductor layer 12 of the operation member 10, respectively. The conductor layer 42 is, for example, connected to a ground potential as in the conductor layer 12.

As in the first embodiment, the electrode substrate 20 includes the detection regions 20a in which the first and second capacitive elements (capacitive sensor) C1, C2 are arranged. In this embodiment, in the electrode substrate 20, the base material that supports the capacitive elements C1, C2 is formed of a flexible plastic film. The electrode substrate 20 is sandwiched between the plurality of first structures 31 and the plurality of second structures 51 and supported by the plurality of second structures 51 with respect to the base substrate 40. The height of the second structures 51 is not particularly limited, and the first structures 31 may have a larger or lower height. Alternatively, the first structures 31 may have the same height as the first structures 31.

The columnar bodies 34 are formed to have the same height as the first structures 31. Each of the columnar bodies 34 is typically located in the center portion of each key region 10a. However, it is not limited thereto. The columnar bodies 34 are formed of, for example, an ultraviolet curable resin and manufactured in the same manner as the first structures 31.

Figure 21:
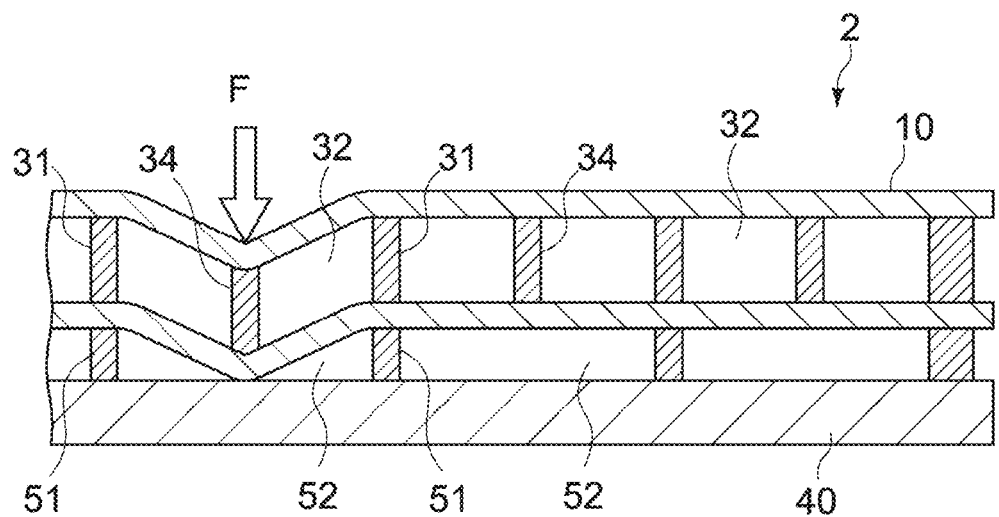
FIG. 21 A cross-sectional view explaining the action of the input apparatus.
Figure 21:
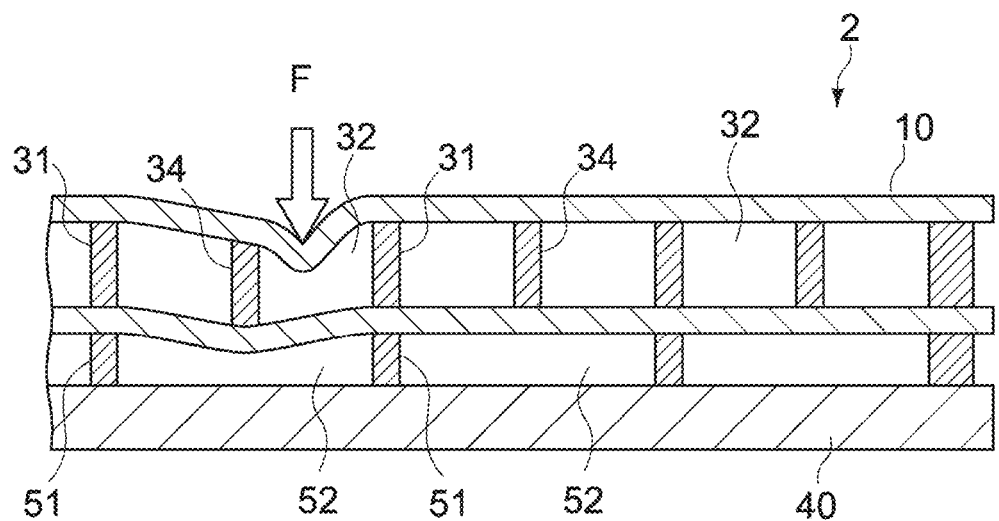

FIG. 21 is a schematic diagram showing the action of the input apparatus 2. The upper section of FIG. 21 is a schematic diagram of deformation when the center of the key region 10a is pressed. The columnar body 34 is in the center portion of the key region 10a. Therefore, the distance between the operation member 10 and the electrode substrate 20 hardly change while the electrode substrate 20 is pressed down toward the base substrate 40 via the second space 52. At this time, the distance between the electrode substrate 20 and the conductor layer 42 of the base substrate 40 is changed and thus a predetermined capacitance change can be obtained.

The lower section of FIG. 21 is a schematic diagram of deformation when a portion between the circumferential portion and the center portion of the key region 10a is pressed. At this time, the operation member 10 generates bending deformation between the first and third structures 31, 33. At the same time, the electrode substrate 20 is pressed down toward the base substrate 40 due to a force applied on the columnar body 34. Due to such deformation, the change of capacitance due to the change of the distance between the operation member 10 and the electrode substrate 20 and the change of capacitance due to the change of the distance between the electrode substrate 20 and the base substrate 40 occur at the same time. It becomes possible to obtain a capacitance change by adding the two changes of capacitance.

Figure 22:
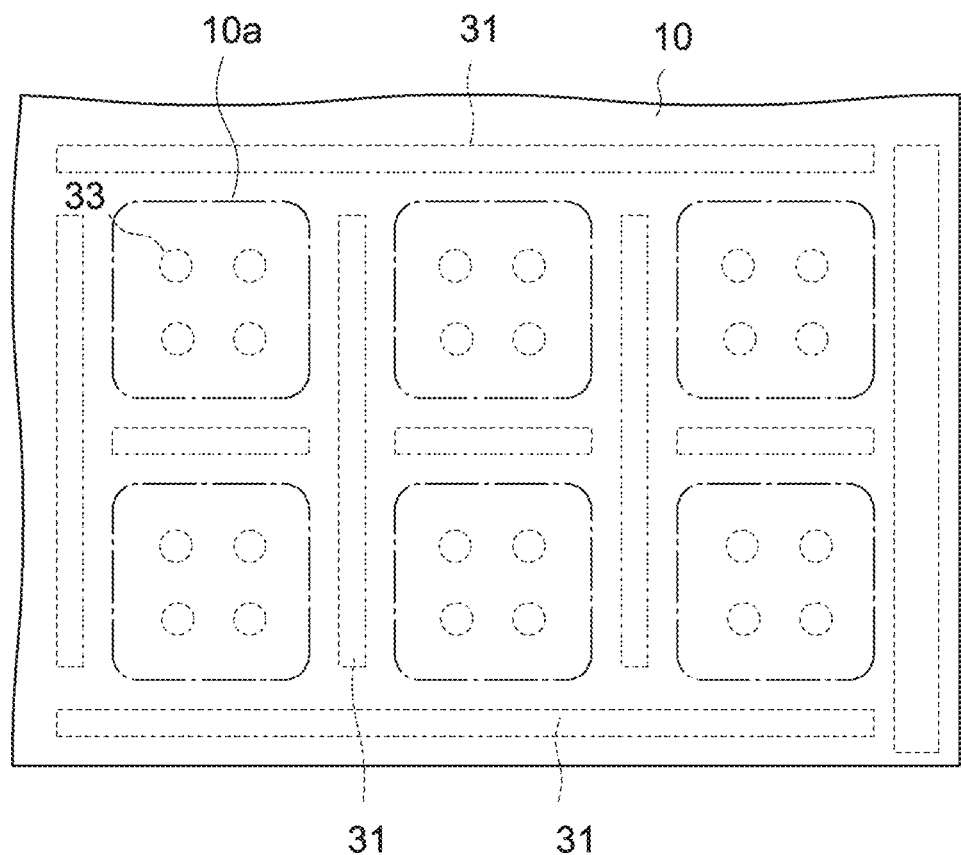
FIG. 22 Main-part plan view and cross-sectional view showing a modified example of the input apparatus.
Figure 22:
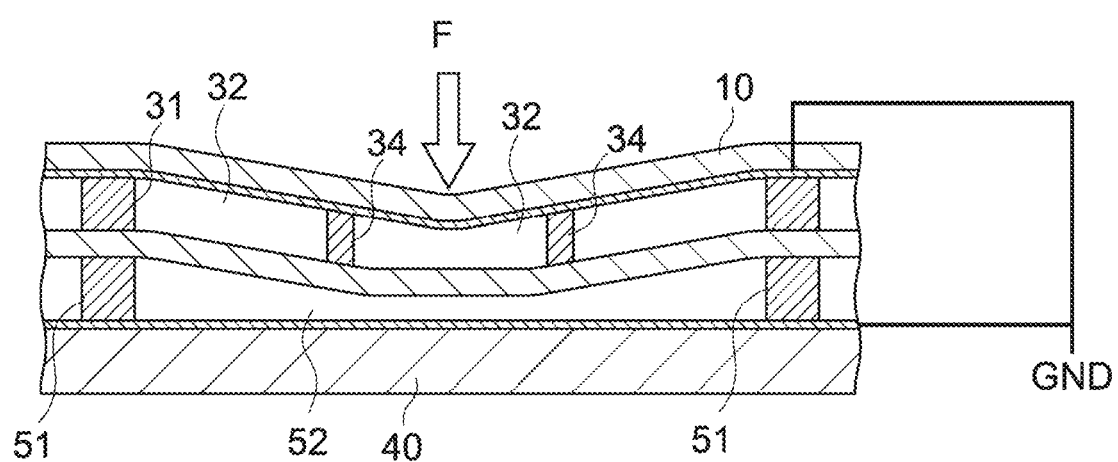

In this embodiment, the example in which the single columnar body 34 is provided in each of the key regions 10a is shown. However, a plurality of the columnar bodies 34 may be provided in each of the key regions 10a. For example, FIG. 22 shows an example in which four columnar bodies 34 are provided in a key region 10a.

In addition, also in the operation member 10 of this embodiment, the coupling regions 13 may be provided for making the flexural rigidity of the key regions 10a higher than the flexural rigidity in other regions as shown in FIGS. 13 and 14.

Although the embodiments of the present technology have been described above, it is needless to say that the present technology is not limited only to the above-mentioned embodiments and various changes can be made without departing from the gist of the present technology.

For example, in each of the above-mentioned embodiments, the example shown in FIGS. 5 and 6 has been described as the shape of the electrodes on the first and second wiring boards 21, 22 constituting the electrode substrate 20. However, of course, the aspect and shape of the electrodes are not limited thereto. Another electrode example is shown in FIG. 23.

Figure 23:
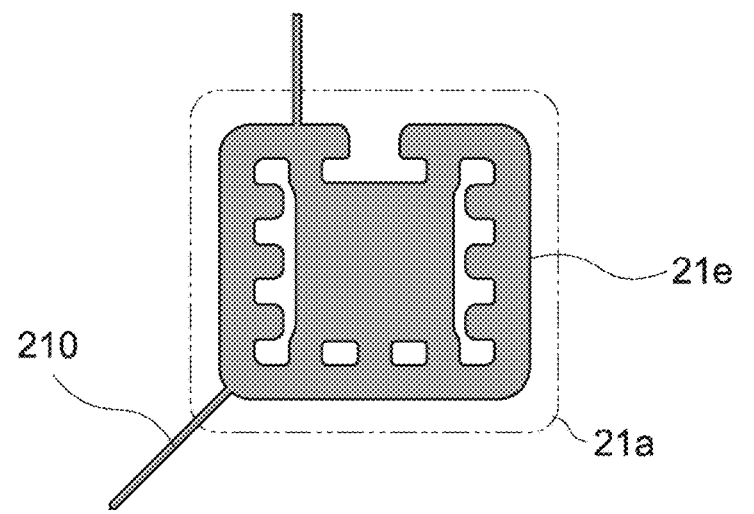
FIG. 23 A main-part plan view showing a modified example of the electrode shape in the input apparatus shown in FIG. 1.
Figure 23:
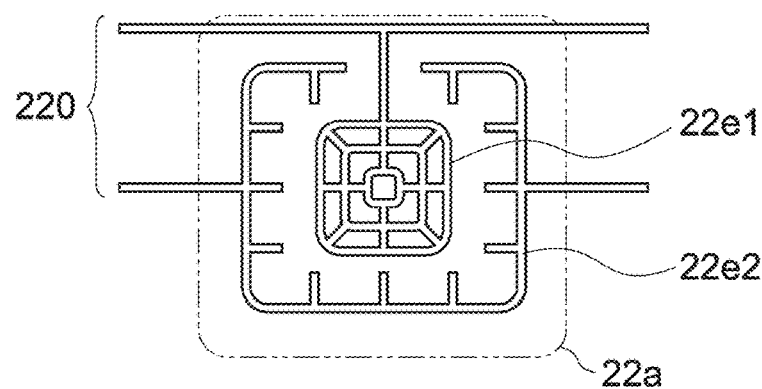
Figure 23:
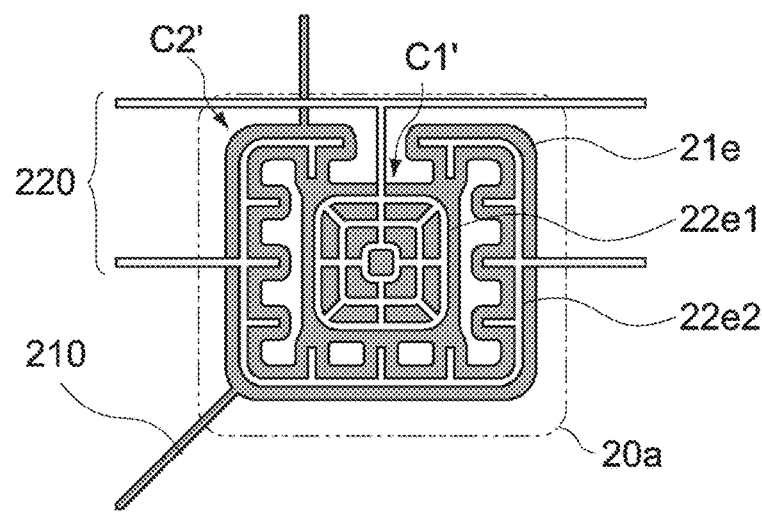

The upper section of FIG. 23 shows the shape of an electrode of the first electrode wire 210. The electrode is formed of a single electrode section 21e formed from the center portion to the circumferential portion of the detection region 21a. The middle section of FIG. 23 shows the shape of an electrode of the second electrode wire 220. The electrode includes a first electrode section 22e1 located in the center portion of the detection region 22a and a second electrode section 22e2 located in a circumferential portion thereof. The lower section of FIG. 23 shows a first capacitive element C1' formed of an electrode section 21e and an electrode section 22e1 and a second capacitive element C2' formed of an electrode section 21e and an electrode section 22e2.

Further, in each of the above-mentioned embodiments, the first and second capacitive elements C1, C2 of the electrode substrate 20 are formed of mutual capacitance type capacitive sensors. However, instead of them, the first and second capacitive elements C1, C2 may be formed of self-capacitance type capacitive sensors. An electrode arrangement example thereof is shown in FIG. 24.

Figure 24:
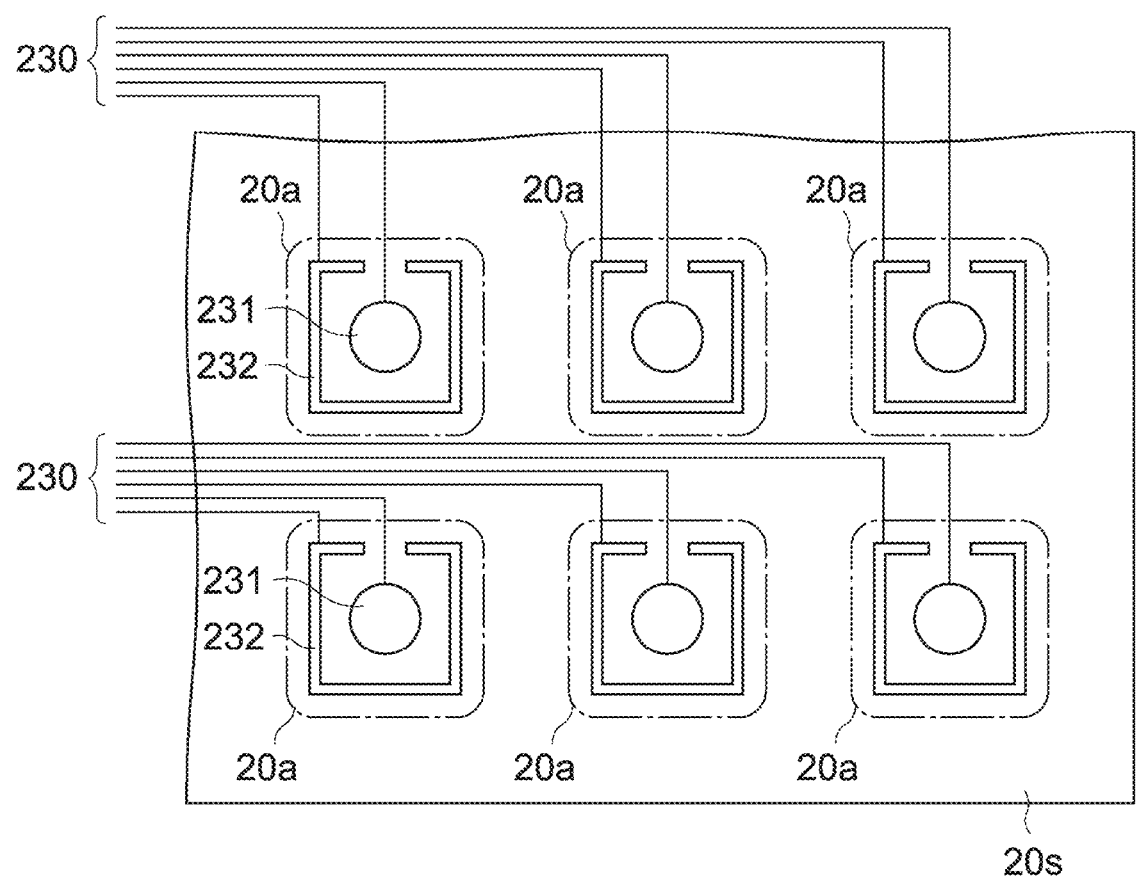
FIG. 24 A main-part plan view showing a modified example of the configuration of the capacitive element in the input apparatus shown in FIG. 1.

The electrode substrate shown in FIG. 24 can be formed of a single base material 20s. In each of the detection regions 20a, a first electrode section 231 positioned in a center portion of the detection region 20a and a second electrode section 232 positioned around the first electrode section are arranged and configured to be electrically connectable to the control unit 60 via electrode wires 230, respectively. The first electrode section 231 configures a first capacitive element by capacitive coupling between the conductor layers 12, 42 of the operation member 10. The second electrode section 232 configures a second capacitive element by capacitive coupling between the conductor layers 12, 42 of the operation member 10. Also with this configuration, the same actions as the above-mentioned embodiments can be obtained.

It should be noted that the present technology may also take the following configurations.

(1) An input apparatus, including:
  a deformable, sheet-like operation member including a plurality of key regions;
  an electrode substrate including
    a first capacitive element arranged opposed to each of the plurality of key regions, and
    a second capacitive element arranged around the first capacitive element, the electrode substrate being capable of electrostatically detecting a change of a distance from each of the plurality of key regions; and
  a first support including
    a plurality of first structures that connect between the electrode substrate and the operation member, and
    a first space that is formed between the plurality of first structures and capable of changing the distance between each of the plurality of key regions and the electrode substrate according to an input operation.

(2) The input apparatus according to (1), in which
  the first capacitive element is arranged opposed to a center portion of each of the plurality of key regions, and
  the second capacitive element is arranged opposed to a circumferential portion of each of the plurality of key regions.

(3) The input apparatus according to (1) or (2), in which
  the electrode substrate further includes a limitation layer that is provided between the second capacitive element and the operation member and partially limits a thickness of the first space.

(4) The input apparatus according to any one of (1) to (3), in which
  the operation member further includes a conductor layer provided on a surface opposed to the electrode substrate.

(5) The input apparatus according to any one of (1) to (4), further including
  a base substrate that is provided opposed to the operation member while sandwiching the electrode substrate therebetween and includes a conductor layer on a surface opposed to the electrode substrate; and
  a second support including
    a plurality of second structures that connect between the electrode substrate and the base substrate and are respectively opposed to the plurality of first structures while sandwiching the electrode substrate therebetween, and
    a second space that is formed between the plurality of second structures and capable of changing the distance between the electrode substrate and the base substrate according to an input operation, in which
  the first support further includes a plurality of third structures that connect between the electrode substrate and the operation member and are arranged in the first space.

(6) The input apparatus according to any one of (1) to (5), in which
  the operation member further includes a coupling region that is supported by the plurality of first structures and couples the plurality of key regions to each other, and
  the coupling region is formed to have flexural rigidity lower than that of the plurality of key regions.

(7) The input apparatus according to (6), in which
  the plurality of key regions are formed to have a thickness larger than that of the coupling region.

(8) The input apparatus according to any one of (1) to (7), further including
  a control unit that is electrically connected to the electrode substrate and configured to generate information on an input operation with respect to each of the plurality of key regions on the basis of outputs of the first capacitive element and the second capacitive element.

(9) The input apparatus according to (8), in which
  the control unit is configured to output an input signal if an amount of capacitance change of the first capacitive element is above a first threshold and an amount of capacitance change of the second capacitive element is above a second threshold smaller than the first threshold.

(10) The input apparatus according to (8) or (9), in which
  the control unit is configured to output an input signal if a difference between an amount of capacitance change of the first capacitive element and an amount of capacitance change of the second capacitive element is above a predetermined threshold.

(11) The input apparatus according to any one of (8) to (10), in which
  the control unit is configured to output an input signal if an amount of capacitance change of the first capacitive element is above a first predetermined value and a time rate of change of capacitance of the first capacitive element is above a second predetermined value.

(12) An input apparatus, including:
  a deformable sheet-like operation member including a plurality of key regions;
  an electrode substrate including a capacitive element that is arranged opposed to each of the plurality of key regions, the electrode substrate being capable of electrostatically detecting the change of the distance from each of the plurality of key regions; and
  a first support including
    a plurality of first structures that connect between the electrode substrate and the operation member, and
    a first space that is formed between the plurality of first structures and capable of changing a distance between each of the plurality of key regions and the electrode substrate according to an input operation, the operation member further including a coupling region that is supported by the plurality of first structures and couples the plurality of key regions to each other, the coupling region being formed to have bending rigidity lower than that of the plurality of key regions.

DESCRIPTION OF SYMBOLS 1, 2 input apparatus
10 operation member
10a key region
12, 42 conductor layer
13 coupling region
20 electrode substrate
30, 50 support
31, 51 structure
32, 52 space
34 columnar body
40 base substrate
60 control unit
202 limitation layer
C1 first capacitive element
C2 second capacitive element

The invention claimed is:

1. An input apparatus, comprising:
a deformable, sheet-like operation member including a plurality of key regions;
an electrode substrate including
a first capacitive element arranged opposed to a center portion of each of the plurality of key regions,
a second capacitive element arranged around the first capacitive element such that at least a majority but less than an entirety of the first capacitive element is enclosed by the second capacitive element on at least one plane, the electrode substrate being capable of electrostatically detecting a change of a distance from each of the plurality of key regions, wherein on the at least one plane, one capacitive element of the first capacitive element and the second capacitive element is rectangular and the other capacitive element of the first capacitive element and the second capacitive element is circular, and
a limitation layer that is provided between the second capacitive element and the operation member and partially limits a thickness of a first space; and
a first support including
a plurality of first structures that connect between the electrode substrate and the operation member, and
the first space that is formed between the plurality of first structures and capable of changing the distance between each of the plurality of key regions and the electrode substrate according to an input operation.

2. The input apparatus according to claim 1, wherein the second capacitive element is arranged opposed to a circumferential portion of each of the plurality of key regions.

3. The input apparatus according to claim 1, wherein the operation member further includes a conductor layer provided on a surface opposed to the electrode substrate.

4. The input apparatus according to claim 1, further comprising
a base substrate that is provided opposed to the operation member while sandwiching the electrode substrate therebetween and includes a conductor layer on a surface opposed to the electrode substrate; and
a second support including
a plurality of second structures that connect between the electrode substrate and the base substrate and are respectively opposed to the plurality of first structures while sandwiching the electrode substrate therebetween, and
a second space that is formed between the plurality of second structures and capable of changing the distance between the electrode substrate and the base substrate according to an input operation, wherein
the first support further includes a plurality of third structures that connect between the electrode substrate and the operation member and are arranged in the first space.

5. The input apparatus according to claim 1, wherein the operation member further includes a coupling region that is supported by the plurality of first structures and couples the plurality of key regions to each other, and
the coupling region is formed to have flexural rigidity lower than that of the plurality of key regions.

6. The input apparatus according to claim 5, wherein the plurality of key regions are formed to have a thickness larger than that of the coupling region.

7. The input apparatus according to claim 1, further comprising
a control unit that is electrically connected to the electrode substrate and configured to generate information on an input operation with respect to each of the plurality of key regions on the basis of outputs of the first capacitive element and the second capacitive element.

8. The input apparatus according to claim 7, wherein the control unit is configured to output an input signal if an amount of capacitance change of the first capacitive element is above a first threshold and an amount of capacitance change of the second capacitive element is above a second threshold smaller than the first threshold.

9. The input apparatus according to claim 7, wherein the control unit is configured to output an input signal if a difference between an amount of capacitance change of the first capacitive element and an amount of capacitance change of the second capacitive element is above a predetermined threshold.

10. The input apparatus according to claim 7, wherein the control unit is configured to output an input signal if an amount of capacitance change of the first capacitive element is above a first predetermined value and a time rate of change of capacitance of the first capacitive element is above a second predetermined value.

11. An electronic apparatus, comprising:
a deformable sheet-like operation member including a plurality of key regions;
an electrode substrate including
a first capacitive element that is arranged opposed to a center portion of each of the plurality of key regions, and
a second capacitive element that is arranged around the first capacitive element such that at least a majority but less than an entirety of the first capacitive element is enclosed by the second capacitive element on at least one plane, the electrode substrate being capable of electrostatically detecting the change of the distance from each of the plurality of key regions, wherein on the at least one plane, one capacitive element of the first capacitive element and the second capacitive element is rectangular and the other capacitive element of the first capacitive element and the second capacitive element is circular;
a first support including a plurality of first structures that connect between the electrode substrate and the operation member, and a first space that is formed between the plurality of first structures and capable of changing a distance between each of the plurality of key regions and the electrode substrate according to an input operation; and a control unit that is electrically connected to the electrode substrate and configured to generate information on an input operation with respect to each of the plurality of key regions on the basis of outputs of the first capacitive element and the second capacitive element, wherein the electrode substrate further includes a limitation layer that is provided between the second capacitive element and the operation member and partially limits a thickness of the first space.

12. The electronic apparatus according to claim 11, wherein the second capacitive element is arranged opposed to a circumferential portion of each of the plurality of key regions.

* * * * *